(12) United States Patent
Fujita et al.

(10) Patent No.: US 8,975,591 B2
(45) Date of Patent: Mar. 10, 2015

(54) SOLID-STATE IMAGING DEVICE AND METHOD OF MANUFACTURING THE SAME, RADIOLOGICAL IMAGING APPARATUS AND METHOD OF MANUFACTURING THE SAME, AND METHOD OF TESTING SOLID-STATE IMAGING DEVICE

(75) Inventors: Kazuki Fujita, Hamamatsu (JP); Ryuji Kyushima, Hamamatsu (JP); Harumichi Mori, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 654 days.

(21) Appl. No.: 13/255,258

(22) PCT Filed: Mar. 26, 2010

(86) PCT No.: PCT/JP2010/055417
§ 371 (c)(1),
(2), (4) Date: Sep. 8, 2011

(87) PCT Pub. No.: WO2010/113809
PCT Pub. Date: Oct. 7, 2010

(65) Prior Publication Data
US 2012/0001081 A1 Jan. 5, 2012

(30) Foreign Application Priority Data

Apr. 1, 2009 (JP) ................. 2009-089261

(51) Int. Cl.
*H04N 5/32* (2006.01)
*H04N 5/374* (2011.01)
*H04N 17/00* (2006.01)
*H01L 27/146* (2006.01)

(52) U.S. Cl.
CPC ............... *H04N 5/32* (2013.01); *H04N 5/3742* (2013.01); *H04N 17/002* (2013.01); *H01L 27/14643* (2013.01)
USPC .................................................. 250/370.11

(58) Field of Classification Search
USPC .................................................. 250/370.11
See application file for complete search history.

(56) References Cited

U.S. PATENT DOCUMENTS

| | | | |
|---|---|---|---|
| 6,133,952 A | 10/2000 | Tewinkle et al. | |
| 2005/0058252 A1* | 3/2005 | Yamada | 378/114 |

FOREIGN PATENT DOCUMENTS

| | | |
|---|---|---|
| EP | 0975025 | 1/2000 |
| JP | 60-55660 | 3/1985 |
| JP | 4-242974 | 8/1992 |
| JP | 2001-8237 | 1/2001 |

(Continued)

*Primary Examiner* — David Porta
*Assistant Examiner* — Shun Lee
(74) *Attorney, Agent, or Firm* — Drinker Biddle & Reath LLP

(57) ABSTRACT

A solid-state imaging device according to an embodiment includes a plurality of signal output units. Each of the plurality of signal output units includes an input terminal electrode group including terminal electrodes for inputting a reset signal, a hold signal, a horizontal start signal, and a horizontal clock signal and an output terminal electrode for providing an output signal. The solid-state imaging device further includes common lines that are provided across the plurality of signal output units. A terminal electrode for the reset signal and a terminal electrode for the hold signal are connected to the corresponding common lines through the corresponding switches.

15 Claims, 10 Drawing Sheets

(56) References Cited

FOREIGN PATENT DOCUMENTS

| | | |
|---|---|---|
| JP | 2003-319270 | 11/2003 |
| JP | 2006-128244 | 5/2006 |
| JP | 2008-177251 | 7/2008 |
| JP | 2008-270650 | 11/2008 |
| WO | 2008/087907 A1 | 7/2008 |

* cited by examiner

SOLID-STATE IMAGING DEVICE AND METHOD OF MANUFACTURING THE SAME, RADIOLOGICAL IMAGING APPARATUS AND METHOD OF MANUFACTURING THE SAME, AND METHOD OF TESTING SOLID-STATE IMAGING DEVICE

TECHNICAL FIELD

The present invention relates to a solid-state imaging device and a method of manufacturing the same, a radiological imaging apparatus and a method of manufacturing the same, and a method of testing a solid-state imaging device.

BACKGROUND ART

Solid-state imaging devices using a CMOS technique have been known. Among them, a passive-pixel-sensor (PPS) solid-state imaging device has been known. The PPS solid-state imaging device includes a light receiving unit in which PPS pixels, each having a photodiode that generates an amount of charge corresponding to intensity of incident light, are two-dimensionally arranged in a matrix of M rows and N columns. Each pixel accumulates the charge generated in the photodiode responsive to incident light and outputs a voltage value corresponding to the amount of accumulated charge as pixel data.

In general, M pixels in each column are connected to an integrating circuit through a readout line that is provided in association with the column. The voltage value output from the integrating circuit is held once and is sequentially output while being controlled by a shift register.

The PPS solid-state imaging device is used for various purposes. For example, the PPS solid-state imaging device is combined with a scintillator unit to form an X-ray flat panel and is used for medical or industrial purposes. Specifically, the PPS solid-state imaging device is used in, for example, an X-ray CT apparatus or a micro focus X-ray inspection apparatus.

During the manufacture of the PPS solid-state imaging device, in general, test probes are placed on terminal electrodes to check the operation of, for example, the light receiving unit, the integrating circuit, or the shift register. For example, Patent Literature 1 discloses a technique for improving the shape of a pad in order to bring the probes into contact with the pads (terminal electrodes) with high accuracy during the test of the solid-state imaging device. In addition, Patent Literature 2 discloses a method of determining whether each element is defective with a probe test, when a plurality of MOS solid-state imaging devices is formed on one semiconductor wafer.

Patent Literature 3 discloses a technique that injects charge into a photodiode of each pixel in the CMOS image sensor, thereby checking the function without emitting light.

CITATION LIST

Patent Literature

Patent Literature 1: Japanese Patent Application Laid-Open No. 2003-319270
Patent Literature 2: Japanese Patent Application Laid-Open No. 2001-8237
Patent Literature 3: Japanese Patent Application Laid-Open No. 2006-128244

SUMMARY OF INVENTION

Technical Problem

When the solid-state imaging device is used in, for example, the X-ray CT apparatus, a light receiving unit with a large area of 12 cm square may be needed. In such a case, in order to manufacture, for example, a large-area light receiving unit or an integrating circuit corresponding to the light receiving unit, a region on the semiconductor wafer is divided into a plurality of regions and a semiconductor structure is formed in each region using a corresponding mask. For example, a plurality of circuit units (hereinafter, referred to as signal output units) each having an integrating circuit or a shift register are provided in association with respective column groups that are divided from N columns in the light receiving unit. The plurality of circuit units is formed so as to have the same structure. Therefore, a number of terminal electrodes for inputting the reset signal of the integrating circuit or the clock signal of the shift register and a number of terminal electrodes for extracting output signals are provided in association with respective column group.

In the solid-state imaging device, for example, during the test of the light receiving unit or the integrating circuit, in the method disclosed in Patent Literature 1 and Patent Literature 2 in which the probes are placed on the terminal electrodes, it is necessary to bring a number of probes into contact with the terminal electrodes at the same time. However, it is difficult to align the positions of the leading ends of the plurality of probes. Therefore, in the method, for example, a contact failure is likely to occur between the probes and the terminal electrodes, which makes it difficult to accurately perform the test.

An object of the present invention is to allow for more accurate and easier testing of a light receiving unit, an integrating circuit, and the like in a large-area solid-state imaging device and a method of manufacturing the same, a radiological imaging apparatus including the large-area solid-state imaging device and a method of manufacturing the same, and a method of testing a large-area solid-state imaging device.

Solution to Problem

According to one embodiment of the present invention, there is provided a solid-state imaging device including: a light receiving unit that includes M×N (M<N and M and N are integers equal to or greater than 2) pixels which are two-dimensionally arranged in a matrix of M rows and N columns and each of which includes a photodiode; a plurality of signal output units that are provided in association with a plurality of column groups, respectively, wherein the column groups are divided from the N columns and each of the column groups includes two or more columns; and a vertical shift register that controls charge outputs from the pixels on row by row basis. That is, the light receiving unit includes M×N pixels. The M×N pixels are arranged in a matrix of M rows and N columns. The light receiving unit includes a plurality of column groups. The column groups include two or more pixel columns different from each other. Each of the plurality of signal output units includes two or more integrating circuits, two or more holding circuits, a horizontal shift register, an input terminal electrode group, and an output terminal electrode. The two or more integrating circuits are provided in association with two or more columns in the corresponding column group, respectively, accumulate charge output from the pixels included in the corresponding column, and convert the charge into a voltage signal. The two or more holding circuits are connected to output ends of the two or more integrating circuits, respectively. The horizontal shift register causes the two or more holding circuits to sequentially output voltage signals. The input terminal electrode group includes a plurality of terminal electrodes. The plurality of terminal electrodes is for inputting a reset signal that resets the integrating circuits, a hold signal that controls input of voltage signals to the holding circuits, a horizontal start signal that starts the operation of the horizontal shift register, a horizontal clock signal that regulates the clock of the horizontal shift register, a vertical start signal that starts the operation of the vertical shift register, and a vertical clock signal that regulates the clock of the vertical shift register. The output terminal electrode provides output signals from the holding circuits.

In the solid-state imaging device, a reset common line for providing the reset signal to the integrating circuits of each signal output unit, a holding common line for providing the hold signal to the holding circuits of each signal output unit, a vertical start common line for providing the vertical start signal to the vertical shift register, and a vertical clock common line for providing the vertical clock signal to the vertical shift register are provided across the plurality of signal output units. In addition, a terminal electrode for the reset signal, a terminal electrode for the hold signal, a terminal electrode for the vertical start signal, and a terminal electrode for the vertical clock signal in each of the signal output units are connected to the reset common line, the holding common line, the vertical start common line, and the vertical clock common line through switches, respectively. Each of the signal output units further includes a control terminal electrode for inputting a switch control signal that controls the turning-on/off of the switches.

The solid-state imaging device is operated as follows. First, when the operation of the light receiving unit and the signal output units is tested, a probe is brought into contact with the control terminal electrode and the switch control signal is given so that the switches are put into a connected state. At the same time, probes are brought into contact with the plurality of terminal electrodes in the input terminal electrode group to supply the respective input signals (the reset signal, the hold signal, the horizontal start signal, the horizontal clock signal, the vertical start signal, and the vertical clock signal). Among the input signals, the horizontal start signal and the horizontal clock signal drive the horizontal shift register in each signal output unit. The reset signal, the hold signal, the vertical start signal, and the vertical clock signal are provided to the reset common line, holding common line, the vertical start common line, and the vertical clock common line through the switches, respectively. The reset signal is distributed to all of the signal output units through the reset common line and is then provided to the integrating circuits of each signal output unit. The hold signal is also distributed to all of the signal output units through the holding common line and is then provided to the holding circuits in each signal output unit. The vertical start signal and the vertical clock signal are provided to the vertical shift register through the vertical start common line and the vertical clock common line and drive the vertical shift register. The resultant output signals are extracted from the output terminal electrode provided in each signal output unit through the probe.

According to the above-mentioned operation, it is possible to appropriately check the operation of one column group in the light receiving unit, the signal output unit corresponding to the column group, and the vertical shift register. In this case, the integrating circuits or the holding circuits included in the other signal output units are also operated. Therefore, the charge generated in regions other than the relevant column group in the light receiving unit is appropriately reset. The series of operations is performed for each of the plurality of column groups. As a result, it is possible to appropriately test the operation of the entire region of the light receiving unit, the plurality of signal output units, and the vertical shift register.

When the solid-state imaging device is normally operated, the switch control signal is given to the control terminal electrode of any one of the signal output units to put the switches of the signal output unit into a connected state, and the reset signal, the hold signal, the vertical start signal, and the vertical clock signal are given from the terminal electrodes of the relevant signal output unit to all of the signal output units.

As described above, according to the solid-state imaging device of the present invention, it is possible to sequentially bring the probes into contact with the column groups divided from the N columns of the light receiving unit, that is, the signal output units to perform the test. Therefore, the number of probes that are brought into contact with the terminal electrodes once is reduced, as compared to a method in which the probes contact the terminal electrodes of all of the signal output units simultaneously. As a result, even when the light receiving unit has a large area, it is possible to accurately and easily test the light receiving unit and the plurality of signal output units.

In addition, in a solid-state imaging device according to one embodiment, the plurality of signal output units may further include respective power supply terminal electrodes for inputting a power supply voltage, and the power supply terminal electrodes of the signal output units may be connected to each other by a line which is provided across the plurality of signal output units. According to this structure, when probes are sequentially brought into contact with the signal output units to perform the test, it is possible to supply the power supply voltage from the terminal electrode of each signal output unit. Therefore, it is possible to perform the test with ease.

According to another embodiment of the present invention, there is provided a radiological imaging apparatus including: the solid-state imaging device according to any one of the above-mentioned embodiments; and a scintillator that is provided on the light receiving unit, generates scintillation light according to incident radiation, converts a radiation image into an optical image, and outputs the optical image to the light receiving unit. The radiological imaging apparatus including the solid-state imaging device according to any one of the above-mentioned embodiments makes it possible to accurately and easily test the light receiving unit and the signal output units of the solid-state imaging device. As a result, it is possible to provide a radiological imaging apparatus with high reliability.

According to another embodiment of the present invention, there is provided a method of manufacturing a solid-state imaging device including a light receiving unit that includes: M×N (M<N and M and N are integers equal to or greater than 2) pixels which are two-dimensionally arranged in a matrix of M rows and N columns and each of which includes a photodiode; a plurality of signal output units that are provided in association with a plurality of column groups, respectively, wherein the column groups are divided from the N columns and each of the column groups includes two or more columns; and a vertical shift register that controls charge outputs from the pixels on row by row basis. The method includes: a forming step of forming, in each of a plurality of regions which will be the plurality of signal output units on a semiconductor substrate, two or more integrating circuits that are provided in association with the two or more columns in a corresponding column group, respectively and each of which accumulates charge output from the pixels in a corresponding column and converts the charge into a voltage signal, two or more holding circuits that are connected to output ends of the two or more integrating circuits, a horizontal shift register that causes the two or more holding circuits to sequentially output voltage signals, an input terminal electrode group including a plurality of terminal electrodes for inputting a reset signal that resets the integrating circuits, a hold signal that controls input of voltage signals to the holding circuits, a horizontal start signal that starts operation of the horizontal shift register, a horizontal clock signal that regulates clock of the horizontal shift register, a vertical start signal that starts operation of the vertical shift register, and a vertical clock signal that regulates clock of the vertical shift register, and an output terminal electrode that provides output signals from the holding circuits, and forming the light receiving unit and the vertical shift register on the semiconductor substrate; a test step of testing the operation of the light receiving unit and the plurality of signal output units on each column group basis and selecting the semiconductor substrate that is normally operated; and a wire bonding step of connecting the input terminal electrode group and the output terminal electrode of each signal output unit in the semiconductor substrate selected in the test step to a wiring pattern that is prepared outside the semiconductor substrate, using wire bonding. In the forming step, a reset common line for providing the reset signal to the integrating circuits of each signal output unit, a holding common line for providing the hold signal to the holding circuits of each signal output unit, a vertical start common line for providing the vertical start signal to the vertical shift register, and a vertical clock common line for providing the vertical clock signal to the vertical shift register are provided across the plurality of signal output units; a terminal electrode for the reset signal, a terminal electrode for the hold signal, a terminal electrode for the vertical start signal, and a terminal electrode for the vertical clock signal in each of the signal output units are connected to the reset common line, the holding common line, the vertical start common line, and the vertical clock common line through switches; and a control terminal electrode for inputting a switch control signal that controls turning-on/off of the switches is formed in each of the signal output units. In the test step, on each signal output unit basis, a probe is brought into contact with the control terminal electrode and the switch control signal is given to the control terminal electrode to put the switches into a connected state; other probes are brought into contact with the input terminal electrode group and the reset signal, the hold signal, the horizontal start signal, the horizontal clock signal, the vertical start signal, and the vertical clock signal are given to the input terminal electrode group; and still another probe is brought into contact with the output terminal electrode to acquire voltage signals, thereby testing operation of the light receiving unit and the plurality of signal output units.

In the method of manufacturing a solid-state imaging device, in the test step, the probes are brought into contact with the control terminal electrode and the input terminal electrode group to supply the signals (the switch control signal, the reset signal, the hold signal, the horizontal start signal, the horizontal clock signal, the vertical start signal, and the vertical clock signal) thereto. In this case, the horizontal start signal and the horizontal clock signal drive the horizontal shift register in each signal output unit. In addition, the reset signal, the hold signal, the vertical start signal, and the vertical clock signal are provided to the reset common line, the holding common line, the vertical start common line, and the vertical clock common line through the switches, respectively. The reset signal is distributed to all of the signal output units through the reset common line and is then provided to the integrating circuits of each signal output unit. The hold signal is also distributed to all of the signal output units through the holding common line and is then provided to the holding circuits of each signal output unit. The vertical start signal and the vertical clock signal are provided to the vertical shift register through the vertical start common line and the vertical clock common line, respectively, and drive the vertical shift register. The resultant output signals are extracted from the output terminal electrode provided in each signal output unit through the probe.

According to the above-mentioned method, it is possible to appropriately check the operation of one column group in the light receiving unit, the signal output unit corresponding to the column group, and the vertical shift register. In this case, the integrating circuits or the holding circuits included in the other signal output units are also operated. Therefore, the charge generated in regions other than the column group in the light receiving unit is appropriately reset. The series of operations is performed for each of the plurality of column groups. In this way, it is possible to appropriately test the operation of the entire region of the light receiving unit, the plurality of signal output units, and the vertical shift register.

When the solid-state imaging device manufactured by the method of manufacturing a solid-state imaging device is normally operated, the switch control signal is given to the control terminal electrode of any one of the signal output units to put the switch of the signal output unit into a connected state, and the reset signal, the hold signal, the vertical start signal, and the vertical clock signal are given from the terminal electrodes of the signal output unit to all of the signal output units.

As described above, according to the method of manufacturing a solid-state imaging device of the invention, it is possible to sequentially bring the probes into contact with the column groups divided from the N columns of the light receiving unit, that is, the signal output units to perform the test. Therefore, the number of probes that are brought into contact with the terminal electrodes once is reduced, as compared to the method in which the probes are brought into contact with the terminal electrodes of all of the signal output units simultaneously. As a result, even when the light receiving unit has a large area, it is possible to accurately and easily test the light receiving unit and the plurality of signal output units.

In a method of manufacturing a solid-state imaging device according to one embodiment, in the forming step, power supply terminal electrodes for inputting a power supply voltage may be formed in the plurality of regions which will be the plurality of signal output units on the semiconductor substrate, respectively, and a line that connects the power supply terminal electrodes of the signal output units with each other may be formed across the plurality of signal output units. According to the method, when the probes are sequentially brought into contact with the signal output units to perform the test, it is possible to supply the power supply voltage from the terminal electrode of each signal output unit. Therefore, it is possible to perform the test with ease.

According to still another embodiment of the present invention, there is provided a method of manufacturing a radiological imaging apparatus including: the method of manufacturing a solid-state imaging device according to any one of the above-mentioned embodiments; and a scintillator attaching step of providing, on the light receiving unit, a scintillator that generates scintillation light according to incident radiation, converts a radiation image into an optical image, and outputs the optical image to the light receiving unit. According to the method of manufacturing a radiological imaging apparatus including the method of manufacturing a solid-state imaging device according to any one the above-mentioned embodiments, it is possible to accurately and easily test the light receiving unit and the plurality of signal output units of the solid-state imaging device and thus provide a radiological imaging apparatus with high reliability.

According to still yet another embodiment of the present invention, there is provided a method of testing a solid-state imaging device including: a light receiving unit that includes M×N (M<N and M and N are integers equal to or greater than 2) pixels which are two-dimensionally arranged in a matrix of M rows and N columns and each of which includes a photodiode; a plurality of signal output units that are provided in association with a plurality of column groups, respectively, wherein the column groups are divided from the N columns and each of the column groups includes two or more columns; and a vertical shift register that controls charge outputs from the pixels on row by row basis. Each of the plurality of signal output units includes: two or more integrating circuits that are provided in association with the two or more columns in the column group, respectively, accumulate charge output from the pixels in the corresponding columns, and convert the charge into a voltage signal; two or more holding circuits that are connected to output ends of the two or more integrating circuits, respectively; a horizontal shift register that causes the two or more holding circuits to sequentially output voltage signals; an input terminal electrode group including a plurality of terminal electrodes for inputting a reset signal that resets the integrating circuits, a hold signal that controls input of voltage signals to the holding circuits, a horizontal start signal that starts operation of the horizontal shift register, a horizontal clock signal that regulates clock of the horizontal shift register, a vertical start signal that starts operation of the vertical shift register, and a vertical clock signal that regulates clock of the vertical shift register; and an output terminal electrode that provides output signals from the holding circuits. The method of testing a solid-state imaging device includes: forming a reset common line for providing the reset signal to the integrating circuits of each signal output unit, a holding common line for providing the hold signal to the holding circuits of each signal output unit, a vertical start common line for providing the vertical start signal to the vertical shift register, and a vertical clock common line for providing the vertical clock signal to the vertical shift register, across the plurality of signal output units, connecting a terminal electrode for the reset signal, a terminal electrode for the hold signal, a terminal electrode for the vertical start signal, and a terminal electrode for the vertical clock signal in each of the signal output units to the reset common line, the holding common line, the vertical start common line, and the vertical clock common line through switches, respectively, and forming a control terminal electrode for inputting a switch control signal that controls connection/disconnection of the switches in each of the signal output; and on each signal output unit basis, bringing a probe into contact with the control terminal electrode and supplying the switch control signal to the control terminal electrode to put the switches into a connected state, bringing other probes into contact with the input terminal electrode group and supplying the reset signal, the hold signal, the horizontal start signal, the horizontal clock signal, the vertical start signal, and the vertical clock signal to the input terminal electrode group, and bringing still another probe into contact with the output terminal electrode to acquire voltage signals, thereby testing operations of the light receiving unit and the plurality of signal output units.

According to the method of testing a solid-state imaging device, similarly to the method of manufacturing a solid-state imaging device, it is possible to sequentially bring the probes into contact with the column groups divided from the N columns of the light receiving unit, that is, the signal output units to perform the test. Therefore, the number of probes that are brought into contact with the terminal electrodes once is reduced, as compared to the method in which the probes are brought into contact with the terminal electrodes of all of the signal output units simultaneously. As a result, even when the light receiving unit has a large area, it is possible to accurately and easily test the light receiving unit and the plurality of signal output units.

Advantageous Effects of Invention

According to the present invention, it is possible to allow for more accurate and easier testing of a light receiving unit, an integrating circuit and the like in a large-area solid-state imaging device and a method of manufacturing the same, a radiological imaging apparatus including the large-area solid-state imaging device and a method of manufacturing the same, and a method of testing a solid-state imaging device.

DESCRIPTION OF EMBODIMENTS

Hereinafter, exemplary embodiments of the present invention will be described in detail with reference to the accompanying drawings. In the description of the drawings, the same components are denoted by the same reference symbols and a description thereof will be omitted.

(First Embodiment)

Figure 1:
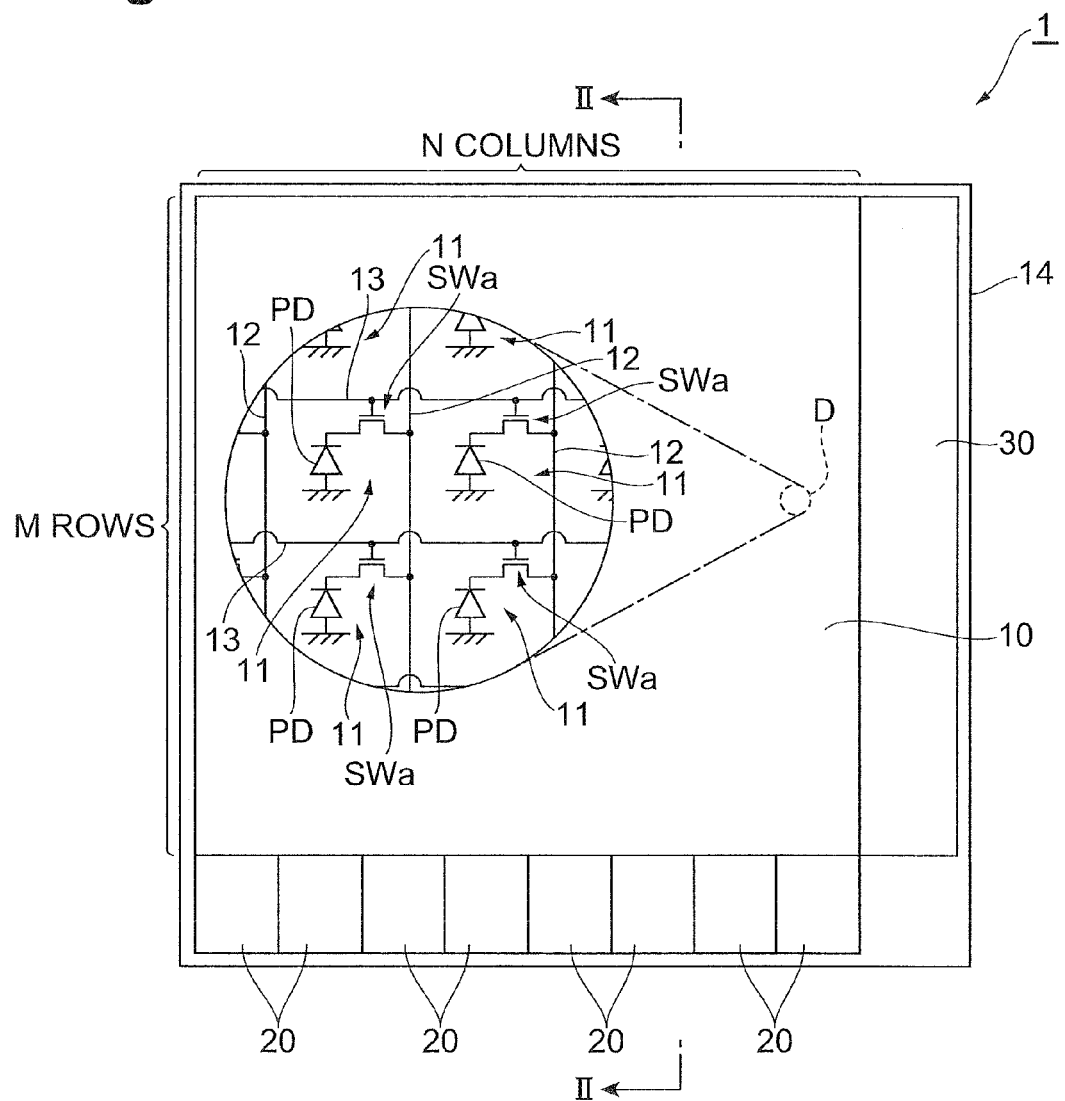
FIG. 1 is a diagram schematically illustrating a structure of a solid-state imaging device 1 according to a first embodiment.
Figure 2:
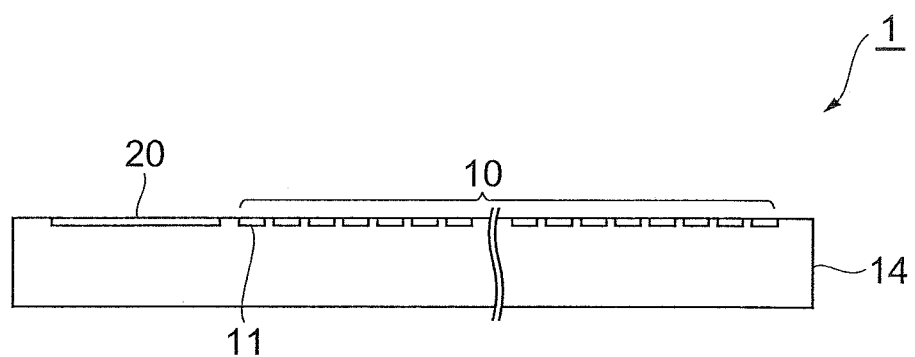
FIG. 2 is a side cross-sectional view illustrating a cross section of the solid-state imaging device 1 taken along the line II-II of FIG. 1.

FIG. 1 is a diagram schematically illustrating a structure of a solid-state imaging device 1 according to an embodiment. FIG. 2 is a side cross-sectional view illustrating a cross section of the solid-state imaging device 1 taken along the line II-II of FIG. 1. The solid-state imaging device 1 according to this embodiment includes a light receiving unit 10, a plurality of signal output units 20, and a vertical shift register 30. In FIG. 1, a region D of the light receiving unit 10 is shown to be enlarged.

As shown in FIG. 1, each of the plurality of signal output units 20 is arranged adjacent to one side of the light receiving unit 10 extending along a row direction, and the vertical shift register 30 is arranged adjacent to another side of the light receiving unit 10 extending along a column direction. The light receiving unit 10 includes M×N pixels 11. The M×N pixels 11 are two-dimensionally arranged in a matrix of M rows and N columns (where M and N are integers equal to or greater than 2). The pixels 11 are of a PPS type and have the same structure.

The N pixels 11 forming each row of the light receiving unit 10 are connected to the vertical shift register 30 via a row selecting line 13 that is provided in association with to the relevant row. The vertical shift register 30 is provided in order to control charge outputs from the pixels 11 on row by row basis. The M pixels 11 forming each column of the light receiving unit 10 have the respective output ends that are connected to one of the plurality of signal output units 20 via a readout line 12 which is provided in association with the relevant column.

Each of the pixels 11 in the light receiving unit 10 includes a photodiode PD and a readout switch SWa. An anode terminal of the photodiode PD is connected to the ground and a cathode terminal of the photodiode PD is connected to the readout line 12 through the readout switch SWa. The photodiode PD generates charge an amount of which corresponds to the intensity of incident light, and accumulates the generated charge in a junction capacitor. A row selection control signal is supplied from the vertical shift register 30 to the readout switch SWa through the row selecting line 13. The row selection control signal is for instructing switching operation of the readout switches SWa of the N pixels 11 in each row of the light receiving unit 10.

In each pixel 11, when the row selection control signal is at a low (L) level, the readout switch SWa is open and the charge generated by the photodiode PD is accumulated in the junction capacitor without being output to the readout line 12. On the other hand, when the row selection control signal is at a high (H) level, the readout switch SWa is closed and the charge that has been generated by the photodiode PD and then accumulated in the junction capacitor is output to the readout line 12 through the readout switch SWa.

The light receiving unit 10, the signal output units 20, and the vertical shift register 30 are provided on a main surface of a semiconductor substrate 14. The semiconductor substrate 14 may be attached to a plate-shaped base material to maintain mechanical strength thereof FIG. 3 is a circuit diagram illustrating in detail a structure of some of the N columns in the light receiving unit 10, a structure of the signal output units 20 corresponding to some columns, and a structure of the vertical shift register 30, among the components of the solid-state imaging device 1 shown in FIG. 1.

The vertical shift register 30 includes a plurality of shift registers 31 that are connected in series to each other, and NOR circuits (NOR gates) 32 and buffers 33 that are provided in association with the rows of the light receiving unit 10, respectively. A vertical clock signal Ckv that regulates operation clock of each shift register 31 is given to each of the plurality of shift registers 31. In addition, a vertical start signal Spy that starts the operation of the vertical shift register 30 is given to one end of a series circuit of the plurality of shift registers 31.

When the vertical start signal Spy is input to the first shift register 31, output voltages Shift from the plurality of shift registers 31 sequentially fall in response to the timing of the vertical clock signal Ckv only for a predetermined period. Then, the output voltages Shift from the shift registers 31 are sequentially input to the respective NOR gates 32 which are provided for the respective rows. The results of the NOR operations between the output voltages Shift and the gate signals Gate are output to the buffers 33, respectively. The signal outputs from the buffers 33 are supplied as row selection control signals Vsel to the row selecting lines 13, respectively. The gate signal Gate is for reducing the time width of a pulse in the row selection control signal Vsel.

Figure 3:
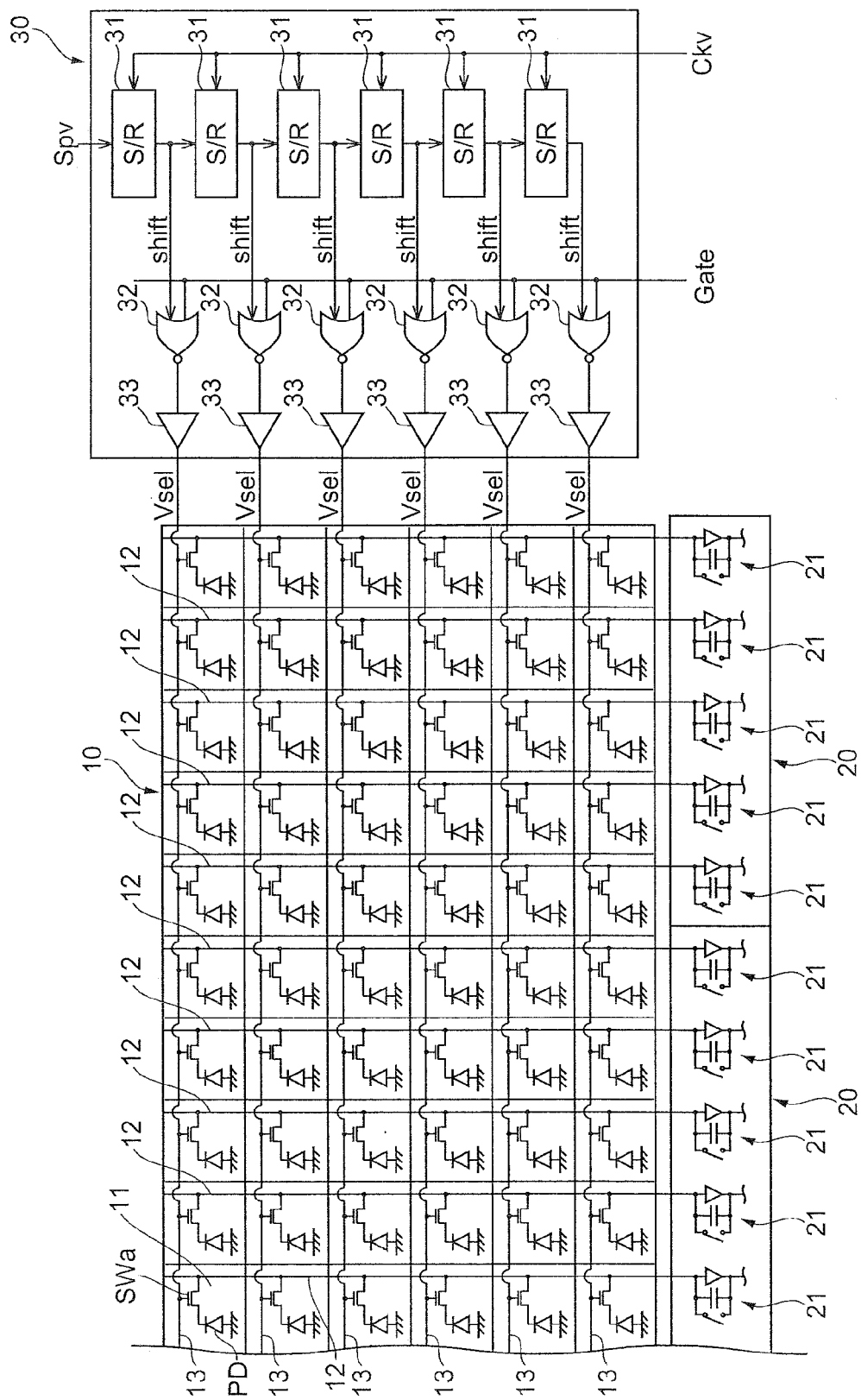
FIG. 3 is a circuit diagram illustrating in detail a structure of some of N columns included in a light receiving unit 10, signal output units 20 corresponding to some columns, and a vertical shift register 30, among components of the solid-state imaging device 1 shown in FIG. 1.

As shown in FIG. 3, in this embodiment, the plurality of signal output units 20 are provided in association with a plurality of column groups of the light receiving unit 10, respectively. The column groups are divided from the N columns of the light receiving unit 10 so that each of the column groups two or more columns. In other words, the light receiving unit 10 includes a plurality of column groups. Each of the plurality of column groups includes two or more different pixel columns among the N pixel columns. The plurality of signal output units 20 are provided in association with the plurality of column groups, respectively. For example, in the circuit shown in FIG. 3, one column group includes five pixel columns, and one signal output unit 20 is provided in association with the five pixel columns. The output ends of the M pixels 11 in each column of the light receiving unit 10 are connected through the readout line 12 to the signal output unit 20 which is provided in association with the column group including the relevant column (specifically, integrating circuit 21 provided for the relevant column in the signal output unit 20)

Figure 4:
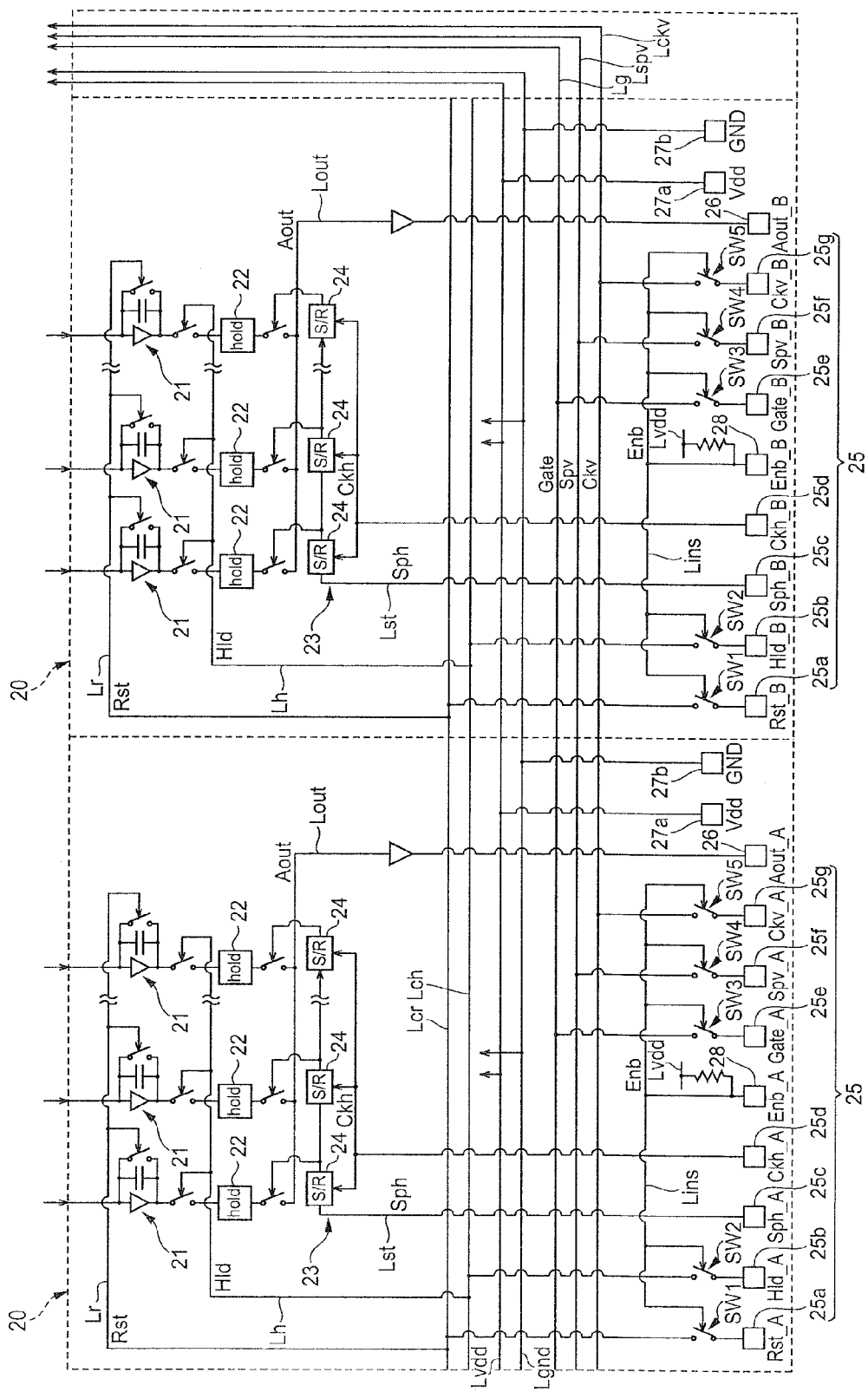
FIG. 4 is a circuit diagram illustrating in detail a structure of the signal output unit 20 among components of the solid-state imaging device 1 shown in FIG. 1.

FIG. 4 is a circuit diagram illustrating in detail a structure of the signal output units 20 among the components of the solid-state imaging device 1 shown in FIG. 1. FIG. 4 shows two signal output units 20 in the vicinity of the vertical shift register 30 (see FIG. 1) among the plurality of signal output units 20.

Each of the plurality of signal output units 20 includes the integrating circuits 21, holding circuits 22, and a horizontal shift register 23. In each signal output unit 20, two or more integrating circuits 21 are provided in association with two or more columns in the column group which is connected to the relevant signal output unit 20, respectively. Each of the integrating circuits 21 includes an input end that is connected to the readout line 12 of the corresponding column. Each of the integrating circuits 21 accumulates the charge that is output from each of the pixels 11 included in the corresponding column through the readout line 12 and outputs a voltage value corresponding to an amount of the accumulated charge from the output end to the corresponding holding circuit 22. The integrating circuits 21 are connected to a reset line Lr. A reset signal Rst is given to the reset line Lr. The reset signal Rst is for instructing switching operation of a switch for discharge in the integrating circuit 21 to reset the integrating circuit 21.

In each signal output unit 20, two or more holding circuits 22 are provided in association with the integrating circuits 21, respectively. Each of the holding circuits 22 has an input end that is connected to the output end of the corresponding integrating circuit 21 through a switch, holds the voltage value input to the input end, and outputs the held voltage value from an output end to a voltage output line Lout through a switch. Each holding circuit 22 is connected to a holding line Lh. A hold signal Hld is given to the holding line Lh. The hold signal Hld is for instructing switching operation of the respective switches between the holding circuits 22 and the integrating circuits 21 to control the input of the voltage signals to the holding circuits 22.

The horizontal shift register 23 sequentially connects the holding circuits 22 with the voltage output line Lout such that the voltage signals are sequentially output from the holding circuits 22. The horizontal shift register 23 includes shift registers 24 (which are mainly configured with flip-flops) whose number is equal to the number of holding circuits 22. The shift registers 24 are connected in series to each other. An input end of the first shift register 24 is connected to a start line Lst. A horizontal start signal Sph is given to the start line Lst. The horizontal start signal Sph is for starting the operation of the horizontal shift register 23. The input ends of the subsequent shift registers 24 are connected to the output ends of the preceding shift registers 24, respectively. Each of the shift register 24 outputs a signal with a predetermined time delay using the signal input to the input end thereof as a trigger. The output end of each shift register 24 is connected to a control end of the switch provided between the holding circuit 22 in the corresponding column and the voltage output line Lout.

The solid-state imaging device 1 according to this embodiment further includes a reset common line Lcr, a holding common line Lch, a gate common line Lg, a vertical start common line Lspv, and a vertical clock common line Lckv. These common lines Lcr, Lch, Lg, Lspv, and Lckv are provided across the plurality of signal output units 20.

The reset common line Lcr is for supplying to the integrating circuits 21 in each signal output unit 20 the reset signal Rst for resetting the integrating circuits 21. The reset common line Lcr is connected to the reset line Lr of each signal output unit 20 such that the reset signal Rst is supplied from the reset common line Lcr to the integrating circuits 21 through the reset line Lr.

The holding common line Lch is for supplying to the holding circuits 22 of each signal output unit 20 the hold signal Hld for controlling input of the voltage signals to the holding circuits 22. The holding common line Lch is connected to the holding line Lh of each signal output unit 20 such that the hold signal Hld is supplied from the holding common line Lch through the holding line Lh to the switches between the holding circuits 22 and the integrating circuits 21.

The gate common line Lg is for supplying the gate signal Gate shown in FIG. 3 to the vertical shift register 30. The vertical start common line Lspv is for supplying the vertical start signal Spy to the vertical shift register 30. The vertical clock common line Lckv is for supplying the vertical clock signal Ckv to the vertical shift register 30. These common lines Lg, Lspv, and Lckv are connected to the vertical shift register 30.

Each of the plurality of signal output units 20 further includes an input terminal electrode group 25. The input terminal electrode group 25 includes a plurality of terminal electrodes (electrode pads) 25a to 25g for signal input.

The terminal electrode 25a is for inputting the reset signal Rst. The terminal electrode 25b is for inputting the hold signal Hld. The terminal electrode 25c is for inputting the horizontal start signal Sph that starts the operation of the horizontal shift register 23. The terminal electrode 25d is for inputting the horizontal clock signal Ckh that regulates the clock of the horizontal shift register 23. The terminal electrodes 25e to 25g are for inputting the gate signal Gate, the vertical start signal Spv, and the vertical clock signal Ckv, respectively.

The reset signal terminal electrode 25a is connected to one end of a switch SW1. The other end of the switch SW1 is connected to the reset common line Lcr. When the switch SW1 is put into a connected state, the reset signal Rst input to the terminal electrode 25a is supplied to the reset common line Lcr.

The hold signal terminal electrode 25b is connected to one end of a switch SW2. The other end of the switch SW2 is connected to the holding common line Lch. When the switch SW2 is put into a connected state, the hold signal Hld input to the terminal electrode 25b is supplied to the holding common line Lch.

The horizontal start signal terminal electrode 25c is connected to the start line Lst. The horizontal start signal Sph input to the terminal electrode 25c is supplied to the first shift register 24 of the horizontal shift register 23 in the signal output unit 20. The horizontal clock signal terminal electrode 25d is connected to the shift registers 24. The horizontal clock signal Ckh input to the terminal electrode 25d is supplied to the shift registers 24 of the signal output unit 20.

The gate signal terminal electrode 25e is connected to one end of a switch SW3. The other end of the switch SW3 is connected to the gate common line Lg. When the switch SW3 is put into a connected state, the gate signal Gate input to the terminal electrode 25e is supplied to the vertical shift register 30.

The vertical start signal terminal electrode 25f is connected to one end of a switch SW4. The other end of the switch SW4 is connected to the vertical start common line Lspv. When the switch SW4 is put into a connected state, the vertical start signal Spy input to the terminal electrode 25f is supplied to the vertical shift register 30.

The vertical clock signal terminal electrode 25g is connected to one end of a switch SW5. The other end of the switch SW5 is connected to the vertical clock common line Lckv. When the switch SW5 is put into a connected state, the vertical clock signal Ckv input to the terminal electrode 25g is supplied to the vertical shift register 30.

Each of the plurality of signal output units 20 further includes an output terminal electrode 26, a power supply terminal electrode 27a, and a reference potential terminal electrode 27b. The output terminal electrode 26 is for providing output signals Aout which are output from the holding circuits 22 through the voltage output line Lout to the outside of the semiconductor substrate 14. The output terminal electrode 26 is connected to the voltage output line Lout through an amplifying element (amplifier).

The power supply terminal electrode 27a is for receiving a power supply voltage. The reference potential terminal electrode 27b is for regulating a reference potential. The power supply terminal electrode 27a and the reference potential terminal electrode 27b are connected to a power supply line Lvdd and a reference potential line Lgnd, respectively. The power supply line Lvdd and the reference potential line Lgnd are provided across the plurality of signal output units 20. A power supply voltage Vdd and a reference potential GND are supplied to the signal output units 20 through the power supply line Lvdd and the reference potential line Lgnd. The power supply line Lvdd and the reference potential line Lgnd extend to the vertical shift register 30 such that the power supply voltage Vdd and the reference potential GND are also supplied to the vertical shift register 30.

Each of the plurality of signal output units 20 further includes a control terminal electrode 28. The control terminal electrode 28 is for inputting a switch control signal Enb. The switch control signal Enb is for collectively controlling the switching of the switches SW1 to SW5 in the relevant signal output unit 20. The control terminal electrode 28 is connected to a switch control line Lins, and the switch control signal Enb is provided to the control terminals of the switches SW1 to SW5 in the relevant signal output unit 20 through the switch control line Lins. The control terminal electrode 28 is connected to the power supply line Lvdd through a resistor.

Figure 5:
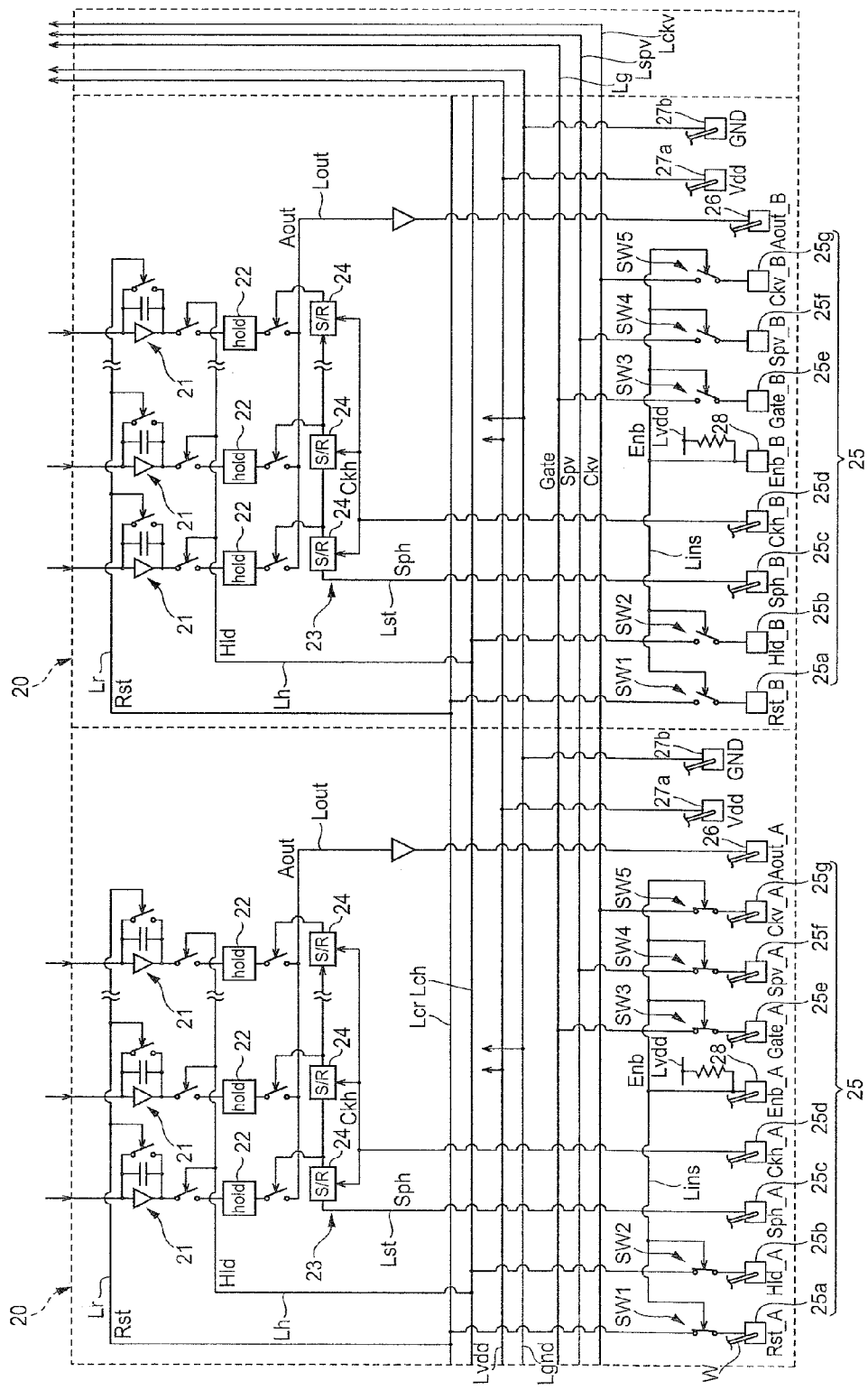
FIG. 5 is a block diagram illustrating a state of the solid-state imaging device 1 in a normal operation mode.
Figure 6:
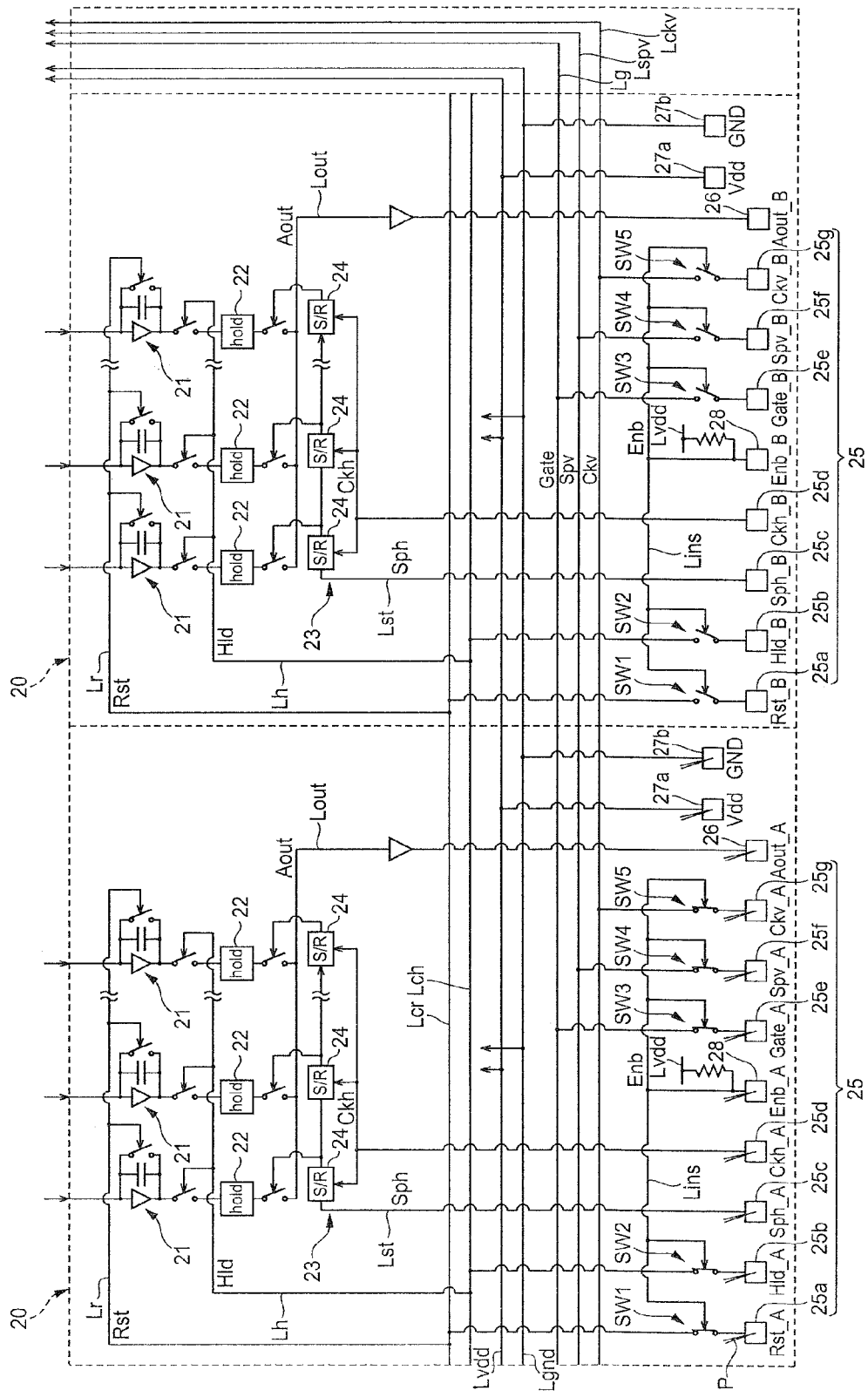
FIG. 6 is a block diagram illustrating a state of the solid-state imaging device 1 in a test mode.
Figure 7:
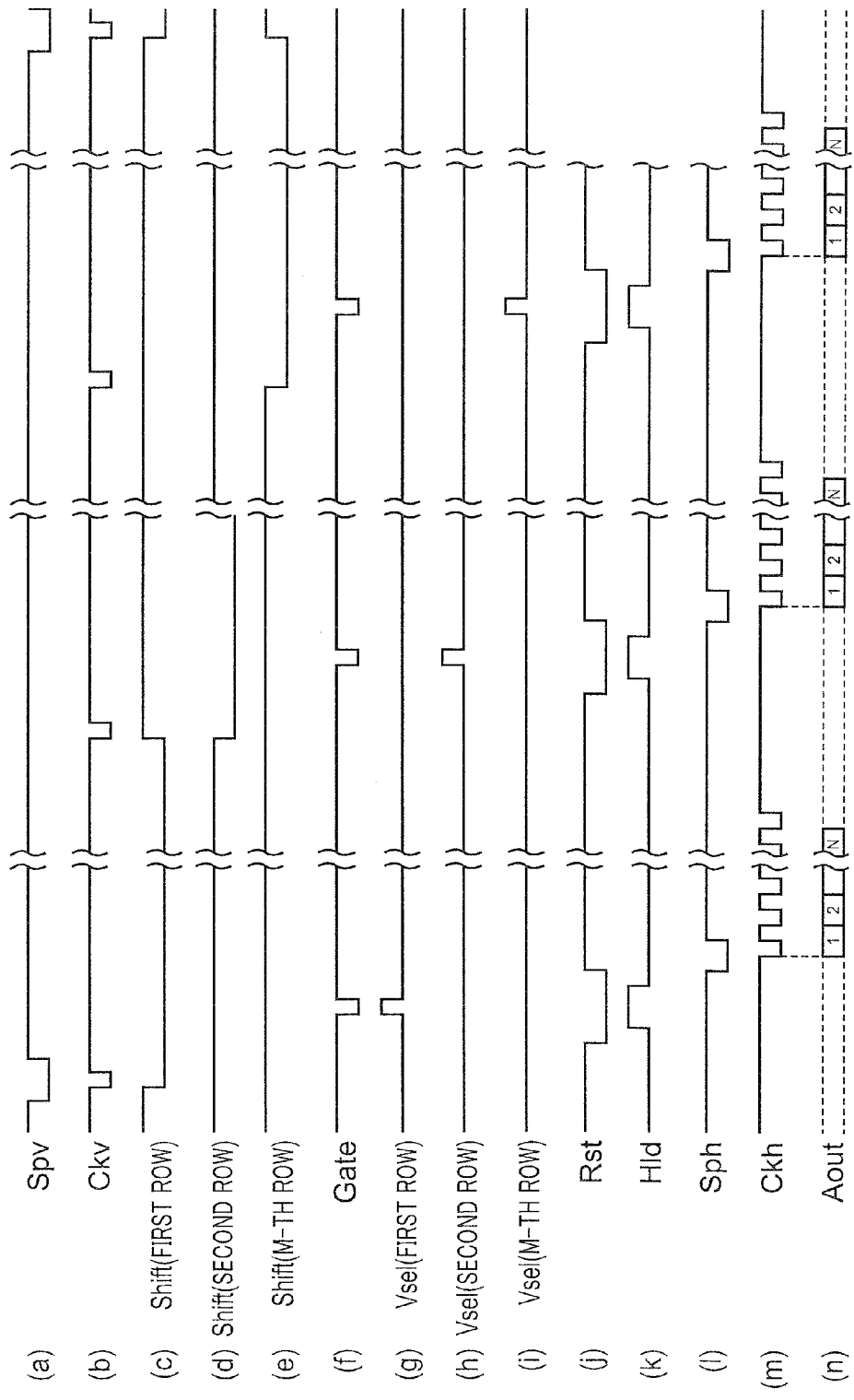
FIG. 7 is a timing chart illustrating each signal in the normal operation mode and the test mode.

Next, the operation of the solid-state imaging device 1 according to this embodiment having the above-mentioned structure will be described. FIG. 5 is a block diagram illustrating a state of the solid-state imaging device 1 during a normal operation (mainly a state of the switches SW1 to SW5. Hereinafter, this state is referred to as a normal operation mode). FIG. 6 is a block diagram illustrating a state of the solid-state imaging device 1 when the functions of the light receiving unit 10, the signal output units 20, and the vertical shift register 30 of the solid-state imaging device 1 are tested by probes (hereinafter, this state is referred to as a test mode). FIG. 7 is a timing chart illustrating each signal in the normal operation mode and the test mode.

First, the normal operation mode of the solid-state imaging device 1 will be described with reference to FIGS. 5 and 7. During the normal operation of the solid-state imaging device 1, as shown in FIG. 5, in all of the signal output units 20, bonding wires W are connected to the horizontal start signal terminal electrode 25c, the horizontal clock signal terminal electrode 25d, the output terminal electrode 26, the power supply terminal electrode 27a, and the reference potential terminal electrode 27b. Then, the horizontal start signal Sph, the horizontal clock signal Ckh, the power supply voltage Vdd, and the reference potential GND are input from, for example, an electronic component that is provided outside the semiconductor substrate 14 to each of the plurality of signal output units 20 through the bonding wires W.

In any one of the plurality of signal output units 20, the bonding wires W are connected to the reset signal terminal electrode 25a, the hold signal terminal electrode 25b, the gate signal terminal electrode 25e, the vertical start signal terminal electrode 25f, the vertical clock signal terminal electrode 25g, and the control terminal electrode 28. Then, the reset signal Rst, the hold signal Hld, the gate signal Gate, the vertical start signal Spv, the vertical clock signal Ckv, and the switch control signal Enb are input from, for example, an electronic component that is provided outside the semiconductor substrate 14 to the relevant signal output unit 20 through the bonding wires W.

In this case, when the switch control signal Enb is input to the control terminal electrode 28 of one signal output unit 20, the potential of the switch control line Lins of the one signal output unit 20 is fixed to the reference potential GND (that is, an L level). Therefore, the switches SW1 to SW5 in the one signal output unit 20 are put into a connected state. In the other signal output units 20, since no signal is input to the control terminal electrode 28, the potential of the switch control line Lins is fixed to the power supply voltage Vdd (that is, an H level). Therefore, the switches SW1 to SW5 in the signal output units 20 are put into an unconnected state.

In this state, first, in the signal output unit 20 to which the switch control signal Enb is input, an L-level pulse signal is input as the vertical start signal Spv to the vertical start signal terminal electrode 25f ((a) of FIG. 7). This pulse signal is supplied to the uppermost shift register 31 (see FIG. 3) of the vertical shift register 30 through the vertical start common line Lspv. During this period, that is, during the period for which the vertical start signal Spv is at an L level, an L-level pulse signal is input as the vertical clock signal Ckv to the vertical clock signal terminal electrode 25g ((b) of FIG. 7). This pulse signal is supplied to the shift registers 31 in the vertical shift register 30 through the vertical clock common line Lckv. As a result, the output voltage Shift from the uppermost shift register 31 is maintained at an L level until the next pulse signal of the vertical clock signal Ckv is input ((c) of FIG. 7).

Then, in the signal output unit 20 to which the switch control signal Enb is input, an L-level voltage is input as the reset signal Rst to the reset signal terminal electrode 25a ((j) of FIG. 7). This voltage is supplied to the integrating circuits 21 in each signal output unit 20 through the reset common line Lcr. As a result, the reset state of each of the integrating circuits 21 in each of the plurality of signal output units 20 is cancelled. During this period, that is, during the period for which the reset signal Rst is at an L level, an H-level voltage is input as the hold signal Hld to the input hold signal terminal electrode 25b ((k) of FIG. 7). This voltage is supplied to each of the plurality of signal output units 20 through the holding common line Lch. As a result, in each of the plurality of signal output units 20, the integrating circuits 21 are connected to the holding circuits 22, respectively.

Then, in the signal output unit 20 in which the switch control signal Enb is input, an L-level pulse signal is input as the gate signal Gate to the gate signal terminal electrode 25e ((f) of FIG. 7). This pulse signal is input to the NOR gates 32 (see FIG. 3) of the vertical shift register 30 through the gate common line Lg. During this period, the uppermost NOR gate 32 performs a NOR operation on the output voltage Shift from the shift register 31 and the gate signal Gate and outputs an H-level pulse signal. This pulse signal is supplied as the row selection control signal Vsel to the row selecting line 13 in the relevant row through the buffer 33 ((g) of FIG. 7). As a result, the readout switch SWa of each of the pixels 11 in the first row of the light receiving unit 10 is closed and the charge generated by the photodiode PD is moved to the integrating circuit 21 through the readout line 12 on column by column basis.

Since the reset state is cancelled, the charge is accumulated in each integrating circuit 21 and a voltage value corresponding to the amount of the accumulated charge is output to the holding circuit 22. This voltage value is held by the holding circuit 22.

In this way, the charge from each of the pixels 11 in the first row of the light receiving unit 10 is held by the holding circuit 22. Then, in the signal output unit 20 in which the switch control signal Enb is input, the hold signal Hld returns to the L level ((k) of FIG. 7) and the reset signal Rst returns to the H level ((j) of FIG. 7). As a result, in each of the plurality of signal output units 20, the integrating circuits 21 are reset, and the integrating circuits 21 are disconnected from the holding circuits 22, respectively.

Then, in each of the plurality of signal output units 20, an L-level pulse signal is input as the horizontal start signal Sph to the horizontal start signal terminal electrode 25c ((l) of FIG. 7). This pulse signal is supplied to the first shift register 24 of the horizontal shift register 23. Then, in response to the horizontal start signal Sph changed to an L level, an L-level pulse signal is input as the horizontal clock signal Ckh to the horizontal clock signal terminal electrode 25d ((m) of FIG. 7). This pulse signal is provided to the shift registers 24 in the horizontal shift register 23. As a result, the output voltages from the shift registers 24 sequentially connects the holding circuits 22 and the voltage output line Lout, and the voltage values held by the holding circuits 22 are sequentially provided as the output signal Aout to the output terminal electrode 26 ((n) of FIG. 7). In this way, the output signal Aout corresponding to the first row of the light receiving unit 10 is extracted from the output terminal electrode 26 of each signal output unit 20 through the bonding wire W.

Then, in the signal output unit 20 in which the switch control signal Enb is input, when the L-level pulse signal is input as the vertical clock signal Ckv to the terminal electrode 25g again ((b) of FIG. 7), the output voltage Shift from the uppermost shift register 31 returns to the H level ((c) of FIG. 7), and the output voltage Shift from the next shift register 31 becomes an H level ((d) of FIG. 7). Then, the reset signal Rst and the hold signal Hld are respectively input to the terminal electrodes 25a and 25b, similarly to the above. Then, an L-level pulse signal is input as the gate signal Gate to the gate signal terminal electrode 25e ((f) of FIG. 7). This pulse signal is input to each NOR gate 32 of the vertical shift register 30. When the gate signal Gate input to the NOR gate 32 returns to the H level, the output signal from the uppermost NOR gate 32 returns to the L level, and the next NOR gate 32 performs a NOR operation on the output voltage Shift from the shift register 31 and the gate signal Gate and outputs an H-level pulse signal as the operation result. This pulse signal is provided as the row selection control signal Vsel to each row selecting line 13 in the relevant row through the buffer 33 ((h) of FIG. 7). As a result, the readout switch SWa of each of the pixels 11 in the second row of the light receiving unit 10 is closed, and the charge generated by the photodiode PD is moved to the integrating circuit 21 through the readout line 12 on column by column basis. Thereafter, similarly to the first row, in each of the plurality of signal output units 20, when the horizontal start signal Sph and the horizontal clock signal Ckh are input ((l) and (m) of FIG. 7), the output signal Aout corresponding to the second row of the light receiving unit 10 is extracted from the output terminal electrode 26 of each signal output unit 20 through the bonding wire W ((n) of FIG. 7).

The above-mentioned operation is sequentially repeated on row by row basis. When an M-th pulse signal is input as the vertical clock signal Ckv ((b) of FIG. 7), the output voltage Shift from the lowermost shift register 31 becomes an H level ((e) of FIG. 7). When a pulse signal is input as the gate signal Gate ((f) of FIG. 7), the output signal from the lowermost NOR gate 32 is provided as the row selection control signal Vsel to each row selecting line 13 in an M-th row through the buffer 33 ((i) of FIG. 7). Similarly to the other rows, when the output signal Aout corresponding to the M-th row of the light receiving unit 10 is extracted from the output terminal electrode 26 of each signal output unit 20 ((n) of FIG. 7), the acquisition of data corresponding to one frame is completed.

Next, the test mode of the solid-state imaging device 1 will be described with reference to FIGS. 6 and 7. The test mode is for testing the functions of the light receiving unit 10, the plurality of signal output units 20, and the vertical shift register 30 before the wires are bonded to each terminal electrode of each signal output unit 20.

First, as shown in FIG. 6, in one of the plurality of signal output units 20, test probes P come into contact with the reset signal terminal electrode 25a, the hold signal terminal electrode 25b, the horizontal start signal terminal electrode 25c, the horizontal clock signal terminal electrode 25d, the gate signal terminal electrode 25e, the vertical start signal terminal electrode 25f, the vertical clock signal terminal electrode 25g, the output terminal electrode 26, the power supply terminal electrode 27a, the reference potential terminal electrode 27b, and the control terminal electrode 28. Then, the reset signal Rst, the hold signal Hld, the horizontal start signal Sph, the horizontal clock signal Ckh, the gate signal Gate, the vertical start signal Spv, the vertical clock signal Ckv, the power supply voltage Vdd, the reference potential GND, and the switch control signal Enb are input to the terminal electrodes through the test probes P, respectively.

In this case, an L-level voltage is applied as the switch control signal Enb to the control terminal electrode 28 and the switches SW1 to SW5 in the relevant signal output unit 20 are put into a connected state, as shown in FIG. 6. In the other signal output units 20, since no signal is input to the control terminal electrode 28, the switches SW1 to SW5 in the other signal output units 20 are put into an connected state.

In this state, the reset signal Rst, the hold signal Hld, the horizontal start signal Sph, the horizontal clock signal Ckh, the gate signal Gate, the vertical start signal Spv, and the vertical clock signal Ckv are changed similarly to (a) to (n) of FIG. 7. As a result, the output signals Aout corresponding to the first to M-th rows of the column group which corresponds to the one signal output unit 20 of the light receiving unit 10 are extracted from the output terminal electrode 26 of the relevant signal output unit 20 through the test probe P. Such a series of operations makes it possible to check the operations of one column group of the light receiving unit 10, the signal output unit 20 corresponding to the one column group, and the vertical shift register 30. In this case, charge is also generated from the pixels 11 in the other column groups of the light receiving unit 10. However, since the reset signal Rst and the hold signal Hld are also provided to the other signal output units 20, the charge is reset in the integrating circuits 21 and is then removed.

For the other signal output units 20, similarly, the test probes P come into contact with the terminal electrode in each signal output unit 20 and the output signals Aout corresponding to the first to M-th rows of the column group are extracted whenever the test probes P contact. In this way, the function test is performed for the entire region of the light receiving unit 10 and all of the plurality of signal output units 20.

According to the solid-state imaging device 1 according to this embodiment having the above-mentioned structure, it is possible to perform the test by sequentially bring the test probes P into contact with a plurality of column groups divided from the N columns of the light receiving unit 10, that is, the signal output units 20. Therefore, the number of test probes P that are brought into contact with the terminal electrodes once is reduced, as compared to the method in which the test probes P contact the terminal electrodes of all of the signal output units 20 simultaneously. Therefore, even when the light receiving unit 10 has a large area, it is possible to accurately and easily test the light receiving unit 10 and the plurality of signal output units 20.

As with this embodiment, each of the plurality of signal output units 20 may include the power supply terminal electrode 27a for inputting the power supply voltage Vdd, and the power supply terminal electrodes 27a of the signal output units 20 may be connected to each other by the power supply line Lvdd that is provided across the plurality of signal output units 20. According to such a structure, in the test mode that tests the light receiving unit 10 and the plurality of signal output units 20, the power supply voltage Vdd can be supplied from any of the signal output units 20. Therefore, it is possible to perform the test with ease.

In addition, for example, the following structure is also conceivable. That is, one input terminal electrode group for test that is used to input the reset signal Rst, the hold signal Hld, the horizontal start signal Sph, the horizontal clock signal Ckh, the gate signal Gate, the vertical start signal Spv, and the vertical clock signal Ckv, and one output terminal electrode for test that is used to output the output signal Aout are provided separately from the signal output units 20. The input terminal electrode group for test and the output terminal electrode for test are connected to the test common lines that are provided across the plurality of signal output units 20. In each signal output unit 20, the connection points of the integrating circuit 21, the holding circuit 22, and the horizontal shift register 23 are switched between the test common lines, and the input terminal electrode group 25 and the output terminal electrode 26.

According to such a structure, it is possible to test the operation of the light receiving unit 10 and the signal output units 20 by bring the test probes into contact with the input terminal electrode group and the output terminal electrode which are separately provided for test, instead of the input terminal electrode group 25 and the output terminal electrode 26 provided in each of the plurality of signal output units 20. Therefore, similarly to the solid-state imaging device 1 according to this embodiment, the number of probes that are brought into contact with the terminal electrodes is reduced. Hence, even when the light receiving unit 10 has a large area, it is possible to accurately and easily test the light receiving unit 10 and the plurality of signal output units 20.

However, this structure has the following new problems. First, the terminal electrodes corresponding to all of the signals required for the operation of each signal output unit 20 are provided outside the signal output units and the number of test common lines that are provided across the plurality of signal output units 20 increases. As a result, it is necessary to ensure a sufficient line space. Second, for example, when the test common line is cut, the abnormal test result is output even though the functions of the light receiving unit 10 and the plurality of signal output units 20 are normal.

In contrast, according to the solid-state imaging device 1 of this embodiment, the lines for some signals (for example, the horizontal start signal Sph and the horizontal clock signal Ckh) may be provided only in each signal output unit 20. Therefore, it is possible to reduce the number of common lines provided across the plurality of signal output units 20 and thus reduce a line space. In addition, most of the lines used in the test mode are also used in the normal operation mode. Therefore, it is possible to prevent problems due to the cutting of the test line.

(Second Embodiment)

Figure 8:
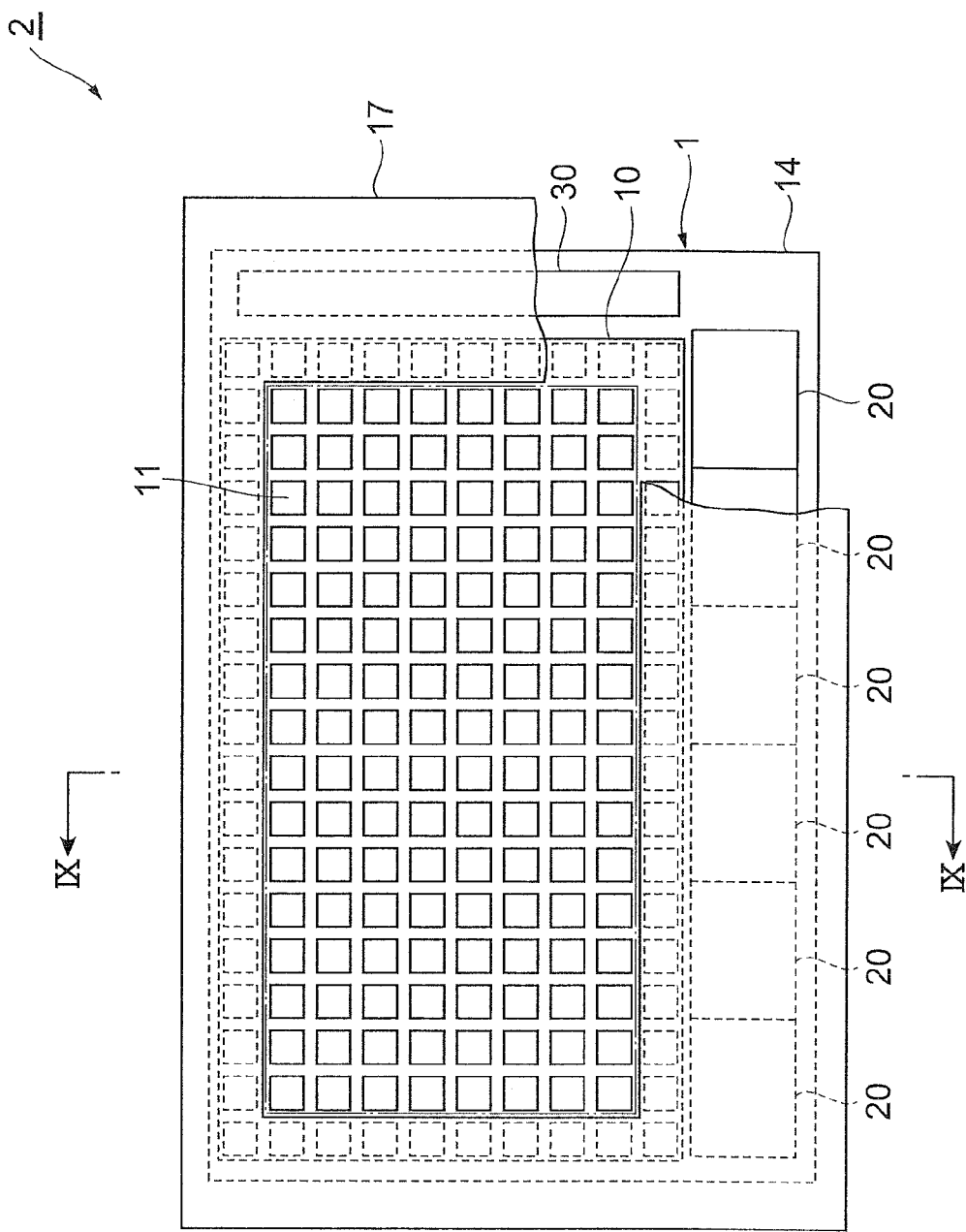
FIG. 8 is a plan view illustrating a structure of a radiological imaging apparatus 2 according to a second embodiment.
Figure 9:
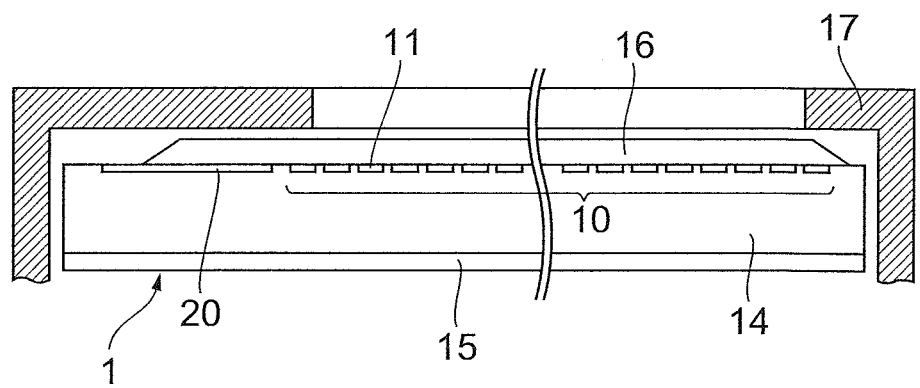
FIG. 9 is a side cross-sectional view illustrating a cross section of the radiological imaging apparatus 2 taken along the line IX-IX of FIG. 8.

FIG. 8 is a plan view illustrating the structure of a radiological imaging apparatus 2 according to a second embodiment of the present invention. FIG. 9 is a side cross-sectional view illustrating the cross section of the radiological imaging apparatus 2 taken along the line IX-IX of FIG. 8.

As shown in FIGS. 8 and 9, the radiological imaging apparatus 2 includes the solid-state imaging device 1 according to the first embodiment, a scintillator 16 (see FIG. 9; not shown in FIG. 8) that is provided on the light receiving unit 10 of the solid-state imaging device 1, and a radiation shielding unit 17. The scintillator 16 generates scintillation light according to incident radiation, such as X-rays, converts a radiation image into an optical image, and outputs the optical image to the light receiving unit 10. The scintillator 16 is provided so as to cover the light receiving unit 10 or it is provided on the light receiving unit 10 by vapor deposition. The radiation shielding unit 17 is made of a material with low radiation transmittance, such as lead. The radiation shielding unit 17 covers the edge of the semiconductor substrate 14 and prevents the incidence of radiation on, for example, the signal output unit 20. In the semiconductor substrate 14, the pixels formed along the edge of the light receiving unit 10 are covered with the radiation shielding unit 17, and configure light-shielding pixels into which no light enters and from which no charge is generated.

The radiological imaging apparatus 2 according to this embodiment includes the solid-state imaging device 1 according to the first embodiment. Therefore, it is possible to accurately and easily test the light receiving unit 10 and the signal output units 20 of the solid-state imaging device 1. As a result, it is possible to provide the radiological imaging apparatus 2 with high reliability.

(Third Embodiment)

Figure 10:
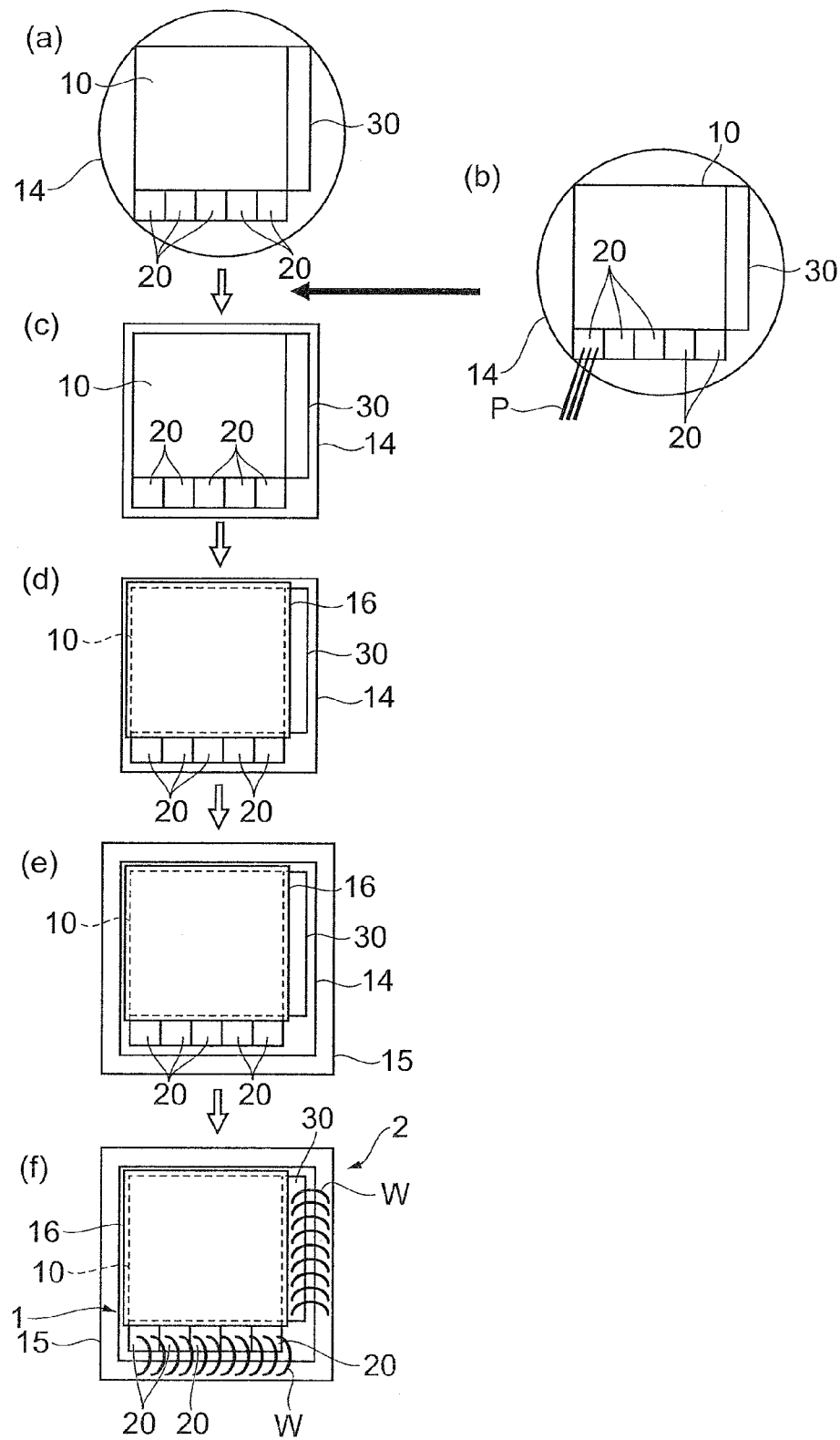
FIG. 10 is a diagram illustrating each step of manufacturing the radiological imaging apparatus 2.

Next, as a third embodiment of the present invention, a method of manufacturing the radiological imaging apparatus 2 according to the second embodiment will be described. The manufacturing method includes a method of manufacturing the solid-state imaging device 1 according to the first embodiment and a method of testing the solid-state imaging device 1. FIG. 10 is a diagram illustrating each step of manufacturing the radiological imaging apparatus 2.

First, as shown in (a) of FIG. 10, the light receiving unit 10, the plurality of signal output units 20, and the vertical shift register 30 described in the first embodiment are formed on the main surface of a wafer-shaped semiconductor substrate 14 by a general semiconductor process technique (forming step).

That is, as the light receiving unit 10, M×N (M and N are integers equal to or greater than 2) pixels 11 (see FIG. 1) each having the photodiode PD and the readout switch SWa are formed on the semiconductor substrate 14. In addition, a plurality of signal output units 20 is formed adjacent to one side of the light receiving unit 10 extending in the row direction and in association with a plurality of column groups each of which has two or more columns and which are divided from N columns. Specifically, as shown in FIG. 4, as each signal output unit 20, two or more integrating circuits 21 that are provided in association with two or more columns included in the corresponding column group, accumulate the charge output from the pixels 11 in the corresponding columns, and convert the charge into a voltage signal, two or more holding circuits 22 that are connected to the output ends of the two or more integrating circuits 21, respectively, the horizontal shift register 23 that causes the two or more holding circuits 22 to sequentially output the voltage signal Aout, the input terminal electrode group 25 including the terminal electrodes 25a to 25g, the output terminal electrode 26, the power supply terminal electrode 27a, the reference potential terminal electrode 27b, and the control terminal electrode 28 are formed in each of the regions which will be the plurality of signal output units 20 on the semiconductor substrate 14. In addition, the vertical shift register 30 shown in FIG. 2 is formed adjacent to another side of the light receiving unit 10 extending in the column direction.

In the forming step, the reset common line Lcr, the holding common line Lch, the gate common line Lg, the vertical start common line Lspv, the vertical clock common line Lckv, the power supply line Lvdd, and the reference potential line Lgnd are formed across the plurality of signal output units 20. Then, in each of the regions which will be the plurality of signal output units 20, the reset signal terminal electrode 25a and the reset common line Lcr are connected to each other through the switch SW1, the hold signal terminal electrode 25b and the holding common line Lch are connected to each other through the switch SW2, the gate signal terminal electrode 25e and the gate common line Lg are connected to each other through the switch SW3, the vertical start signal terminal electrode 25f and the vertical start common line Lspv are connected to each other through the switch SW4, and the vertical clock signal terminal electrode 25g and the vertical clock common line Lckv are connected to each other through the switch SW5. In addition, the power supply terminal electrode 27a and the power supply line Lvdd are connected to each other and the reference potential terminal electrode 27b and the reference potential line Lgnd are connected to each other. The control terminals of the switches SW1 to SW5 are connected to the control terminal electrode 28.

In the forming step, in each of the regions which will be the plurality of signal output units 20, the horizontal start signal terminal electrode 25c is connected to the first shift register 24 in the horizontal shift register 23. The horizontal clock signal terminal electrode 25d is connected to the shift registers 24 in the horizontal shift register 23.

Then, the operation of the light receiving unit 10 and the plurality of signal output units 20 is tested on each column group basis (that is, on each signal output unit 20 basis) and the semiconductor substrate 14 in which the light receiving unit 10 and the plurality of signal output units 20 are normally operated is selected from a plurality of semiconductor substrates 14 (test step).

That is, as shown in (b) of FIG. 10, the test probe P are sequentially brought into contact with the plurality of signal output units 20 and signals are input thereto. In this case, each signal output unit 20 enters into the test mode by the contact of the test probe P. Specifically, as shown in FIG. 6, in one signal output unit 20, the test probes P are brought into contact with the power supply terminal electrode 27a and the reference potential terminal electrode 27b to input the power supply voltage Vdd and the reference potential GND thereto. In addition, another test probe P is brought into contact with the control terminal electrode 28 to input the switch control signal Enb thereto. In this way, each of the switches SW1 to SW5 is put into a connected state. At the same time, other test probes P are brought into contact with the terminal electrodes 25a to 25g in the input terminal electrode group 25 to supply the reset signal Rst, the hold signal Hld, the horizontal start signal Sph, the horizontal clock signal Ckh, the gate signal Gate, the vertical start signal Spv, and the vertical clock signal Ckv to the terminal electrodes 25a to 25g in the input terminal electrode group 25, respectively. In this way, the signal output units 20 and the vertical shift register 30 are operated in the test mode, and another test probe P is brought into contact with the output terminal electrode 26 to acquire the voltage signal Aout. As a result, it is possible to test a column group corresponding to the relevant signal output unit 20 in the light receiving unit 10 and the operation of the relevant signal output unit 20. This operation is performed on each of the plurality of signal output units 20, thereby appropriately testing the entire region of the light receiving unit 10 and the operation of all of the signal output units 20.

Then, as shown in (c) of FIG. 10, a peripheral portion of the light receiving unit 10, the plurality of signal output units 20, and the vertical shift register 30 in the semiconductor substrate 14 is cut by dicing (cutting step). It should be noted that the test step shown in (b) of FIG. 10 may be performed after the cutting step.

Then, as shown in (d) of FIG. 10, the scintillator 16 is provided on the light receiving unit 10 (scintillator attaching step). In this case, as the scintillator 16, a scintillator panel may be provided so as to cover the light receiving unit 10, or a scintillator material may be formed on the light receiving unit 10 by vapor deposition. In addition, in this case, the scintillator 16 is provided such that the terminal electrodes 25a to 25g, 26, 27a, 27b, and 28 of each of the plurality of signal output units 20 are exposed.

Then, as shown in (e) of FIG. 10, the semiconductor substrate 14 is fixed to a wiring substrate 15, and the terminal electrodes of each signal output unit 20 are connected to a wiring pattern that is prepared outside the semiconductor substrate 14 by the bonding wires W (wire bonding step). In this case, as shown in FIG. 5, in each of the plurality of signal output units 20, the bonding wires W are connected to the horizontal start signal terminal electrode 25c, the horizontal clock signal terminal electrode 25d, the output terminal electrode 26, the power supply terminal electrode 27a, and the reference potential terminal electrode 27b. In only one of the plurality of signal output units 20, the bonding wires W are connected to the reset signal terminal electrode 25a, the hold signal terminal electrode 25b, the gate signal terminal electrode 25e, the vertical start signal terminal electrode 25f, the vertical clock signal terminal electrode 25g, and the control terminal electrode 28.

The solid-state imaging device 1 and the radiological imaging apparatus 2 including the solid-state imaging device 1 are manufactured by the above-mentioned steps.

The methods of manufacturing and testing the solid-state imaging device 1 and the radiological imaging apparatus 2 have the following advantages. That is, in the test step, the test probe P can be sequentially brought into contact with a plurality of column groups which are divided from N columns of the light receiving unit 10, that is, for the signal output units 20 to perform the test. Therefore, the number of test probes P that are brought into contact with the terminal electrodes once is reduced, as compared to the method in which the test probes P are brought into contact with the terminal electrodes of all of the signal output units 20 at the same time. Therefore, even when the light receiving unit 10 has a large area, it is possible to accurately and easily test the light receiving unit 10 and the plurality of signal output units 20.

In addition, as with this embodiment, in the forming step, the power supply terminal electrode 27a for inputting the power supply voltage Vdd is formed in each of the regions which will be the plurality of signal output units 20 on the semiconductor substrate 14, and the power supply line Lvdd that connects the power supply terminal electrodes 27a of the signal output units 20 is formed across the plurality of signal output units 20. According to this structure, in the test step, it is possible to supply the power supply voltage Vdd from any signal output unit 20. Therefore, it is possible to perform the test with ease.

The solid-state imaging device and the method of manufacturing the same, the radiological imaging apparatus and the method of manufacturing the same, and the method of testing the solid-state imaging device according to the present invention are not limited to the above-described embodiments, but various modifications and changes of the invention can be made. For example, in the third embodiment, the test step is performed before the scintillator attaching step. However, in the invention, the test step may be performed after the scintillator attaching step.

REFERENCE SIGNS LIST

1: SOLID-STATE IMAGING DEVICE
2: RADIOLOGICAL IMAGING APPARATUS
10: LIGHT RECEIVING UNIT
11: PIXEL
12: READOUT LINE
13: ROW SELECTING LINE
14: SEMICONDUCTOR SUBSTRATE
15: WIRING SUBSTRATE
16: SCINTILLATOR
17: RADIATION SHIELDING UNIT
20: SIGNAL OUTPUT UNIT
21: INTEGRATING CIRCUIT
22: HOLDING CIRCUIT
23: HORIZONTAL SHIFT REGISTER
24: SHIFT REGISTER

25: INPUT TERMINAL ELECTRODE GROUP
25a TO 25g: TERMINAL ELECTRODE
26: OUTPUT TERMINAL ELECTRODE
27a: POWER SUPPLY TERMINAL ELECTRODE
27b: REFERENCE POTENTIAL TERMINAL ELECTRODE
28: CONTROL TERMINAL ELECTRODE
30: VERTICAL SHIFT REGISTER
31: SHIFT REGISTER
32: NOR GATE
33: BUFFER
Aout: OUTPUT SIGNAL
Ckh: HORIZONTAL CLOCK SIGNAL
Ckv: VERTICAL CLOCK SIGNAL
Enb: SWITCH CONTROL SIGNAL
Gate: GATE SIGNAL
Hld: HOLD SIGNAL
Rst: RESET SIGNAL
Sph: HORIZONTAL START SIGNAL
Spv: VERTICAL START SIGNAL
Vsel: ROW SELECTION CONTROL SIGNAL
Lch: HOLDING COMMON LINE
Lcr: RESET COMMON LINE
Lgnd: REFERENCE POTENTIAL LINE
Lh: HOLDING LINE
Lins: SWITCH CONTROL LINE
Lout: VOLTAGE OUTPUT LINE
Lr: RESET LINE
Lst: START LINE
Lvdd: POWER SUPPLY LINE
P: TEST PROBE
PD: PHOTODIODE
SW1 TO SW5: SWITCH
SWa: READOUT SWITCH
W: BONDING WIRE

The invention claimed is:

1. A solid-state imaging device comprising:
a light receiving unit that includes M×N (M and N are integers equal to or greater than 2) pixels, the pixels being two-dimensionally arranged in a matrix of M rows and N columns and each of the pixels including a photodiode;
a plurality of signal output units that are provided in association with a plurality of column groups, respectively, wherein the column groups are divided from the N columns and each of the column groups includes two or more columns; and
a vertical shift register that controls charge outputs from the pixels on row by row basis,
wherein each of the plurality of signal output units includes:
two or more integrating circuits that are provided in association with the two or more columns included in a corresponding column group, respectively, each of the integrating circuits being configured to accumulate charge output from the pixels included in a corresponding column and to convert the charge into a voltage signal;
two or more holding circuits that are connected to output ends of the two or more integrating circuits, respectively;
a horizontal shift register that causes the two or more holding circuits to sequentially output voltage signals;
an input terminal electrode group including a plurality of terminal electrodes for inputting a reset signal that resets the integrating circuits, a hold signal that controls input of voltage signals to the holding circuits, a horizontal start signal that starts operation of the horizontal shift register, a horizontal clock signal that regulates clock of the horizontal shift register, a vertical start signal that starts operation of the vertical shift register, and a vertical clock signal that regulates clock of the vertical shift register; and
an output terminal electrode that provides output signals from the holding circuits,
a reset common line for providing the reset signal to the integrating circuits of each of the signal output units, a holding common line for providing the hold signal to the holding circuits of each of the signal output units, a vertical start common line for providing the vertical start signal to the vertical shift register, and a vertical clock common line for providing the vertical clock signal to the vertical shift register are provided across the plurality of signal output units,
a terminal electrode for the reset signal, a terminal electrode for the hold signal, a terminal electrode for the vertical start signal, and a terminal electrode for the vertical clock signal in each of the signal output units are connected to the reset common line, the holding common line, the vertical start common line, and the vertical clock common line through switches, respectively, and
each of the signal output units further includes a control terminal electrode for inputting a switch control signal that controls connection/disconnection of the switches.

2. The solid-state imaging device according to claim 1, wherein the plurality of signal output units further includes respective power supply terminal electrodes for inputting a power supply voltage, and
the power supply terminal electrodes of the signal output units are connected to each other through a line which is provided across the plurality of signal output units.

3. A radiological imaging apparatus comprising:
the solid-state imaging device according to claim 1; and
a scintillator that is provided on the light receiving unit, generates scintillation light according to incident radiation, converts a radiation image into an optical image, and outputs the optical image to the light receiving unit.

4. A method of manufacturing a solid-state imaging device, wherein the solid-state imaging device includes:
a light receiving unit that includes M×N (M and N are integers equal to or greater than 2) pixels, the pixels being two-dimensionally arranged in a matrix of M rows and N columns and each of the pixels including a photodiode;
a plurality of signal output units that are provided in association with a plurality of column groups, respectively, wherein the column groups are divided from the N columns and each of the column groups includes two or more columns; and
a vertical shift register that controls charge outputs from the pixels on row by row basis,
the method comprising:
a forming step of forming, in each of a plurality of regions which will be the plurality of signal output units on a semiconductor substrate, two or more integrating circuits that are provided in association with the two or more columns in a corresponding column group, respectively, each of the integrating circuits being configured to accumulate charge output from the pixels in a corresponding column and to convert the charge into a voltage signal, two or more holding circuits that are connected to output ends of the two or more integrating circuits, a horizontal shift register that causes the two or more holding circuits to sequentially output voltage signals, an input terminal electrode group including a plurality of terminal electrodes for inputting a reset signal that resets the integrating circuits, a hold signal that controls input of voltage signals to the holding circuits, a horizontal start signal that starts operation of the horizontal shift register, a horizontal clock signal that regulates clock of the horizontal shift register, a vertical start signal that starts operation of the vertical shift register, and a vertical clock signal that regulates clock of the vertical shift register, and an output terminal electrode that provides output signals from the holding circuits, and forming the light receiving unit and the vertical shift register on the semiconductor substrate;

a test step of testing operation of the light receiving unit and the plurality of signal output units on each column group basis; and a wire bonding step of connecting the input terminal electrode group and the output terminal electrode of each of the signal output units in the semiconductor substrate selected in the test step to a wiring pattern that is prepared outside the semiconductor substrate, using wire bonding, wherein, in the forming step, a reset common line for providing the reset signal to the integrating circuits of each of the signal output units, a holding common line for providing the hold signal to the holding circuits of each of the signal output units, a vertical start common line for providing the vertical start signal to the vertical shift register, and a vertical clock common line for providing the vertical clock signal to the vertical shift register are provided across the plurality of signal output units; a terminal electrode for the reset signal, a terminal electrode for the hold signal, a terminal electrode for the vertical start signal, and a terminal electrode for the vertical clock signal in each of the signal output units are connected to the reset common line, the holding common line, the vertical start common line, and the vertical clock common line through switches, respectively; and a control terminal electrode for inputting a switch control signal that controls connection/disconnection of the switches is formed in each of the signal output units, and in the test step, on each signal output unit basis, a probe is brought into contact with the control terminal electrode and the switch control signal is given to the control terminal electrode to put the switches into a connected state; other probes are brought into contact with the input terminal electrode group and the reset signal, the hold signal, the horizontal start signal, the horizontal clock signal, the vertical start signal and the vertical clock signal are given to the input terminal electrode group; and still another probe is brought into contact with the output terminal electrode to acquire voltage signals, thereby testing operation of the light receiving unit and the plurality of signal output units.

5. The method of manufacturing a solid-state imaging device according to claim 4, wherein, in the forming step, power supply terminal electrodes for inputting a power supply voltage are formed in the plurality of regions which will be the plurality of signal output units on the semiconductor substrate, respectively, and a line that connects the power supply terminal electrodes of the signal output units with each other is formed across the plurality of signal output units.

6. A method of manufacturing a radiological imaging apparatus comprising:

the method of manufacturing a solid-state imaging device according to claim 4; and a scintillator attaching step of providing, on the light receiving unit, a scintillator that generates scintillation light according to incident radiation, converts a radiation image into an optical image, and outputs the optical image to the light receiving unit, wherein the scintillator attaching step is performed before or after the test step.

7. A method of testing a solid-state imaging device, wherein the solid-state imaging device includes:

a light receiving unit that includes M×N (M and N are integers equal to or greater than 2) pixels, the pixels being two-dimensionally arranged in a matrix of M rows and N columns and each of the pixels including a photodiode;

a plurality of signal output units that are provided in association with a plurality of column groups, respectively, wherein the column groups are divided from the N columns and each of the column groups includes two or more columns; and a vertical shift register that controls charge outputs from the pixels on row by row basis, and wherein each of the plurality of signal output units includes:

two or more integrating circuits that are provided in association with the two or more columns included in a corresponding column group, respectively, each of the integrating circuits being configured to accumulate charge output from the pixels included in a corresponding column and to convert the charge into a voltage signal;

two or more holding circuits that are connected to output ends of the two or more integrating circuits, respectively;

a horizontal shift register that causes the two or more holding circuits to sequentially output voltage signals;

an input terminal electrode group including a plurality of terminal electrodes for inputting a reset signal that resets the integrating circuits, a hold signal that controls input of voltage signals to the holding circuits, a horizontal start signal that starts operation of the horizontal shift register, a horizontal clock signal that regulates clock of the horizontal shift register, a vertical start signal that starts operation of the vertical shift register, and a vertical clock signal that regulates clock of the vertical shift register; and an output terminal electrode that provides output signals from the holding circuits, the method comprising:

forming a reset common line for providing the reset signal to the integrating circuits of each of the signal output units, a holding common line for providing the hold signal to the holding circuits of each of the signal output unit, a vertical start common line for providing the vertical start signal to the vertical shift register, and a vertical clock common line for providing the vertical clock signal to the vertical shift register, across the plurality of signal output units, connecting a terminal electrode for the reset signal, a terminal electrode for the hold signal, a terminal electrode for the vertical start signal, and a terminal electrode for the vertical clock signal in each of the signal output units to the reset common line, the holding common line, the vertical start common line, and the vertical clock common line through switches, respectively, and forming a control terminal electrode for inputting a switch control signal that controls connection/disconnection of the switches in each of the signal output units; and on each signal output unit basis, bringing a probe into contact with the control terminal electrode and supplying the switch control signal to the control terminal electrode to put the switches into a connected state, bringing other probes into contact with the input terminal electrode group and supplying the reset signal, the hold signal, the horizontal start signal, the horizontal clock signal, the vertical start signal, and the vertical clock signal to the input terminal electrode group, and bringing still another probe into contact with the output terminal electrode to acquire voltage signals, thereby testing operations of the light receiving unit and the plurality of signal output units.

8. A solid-state imaging device comprising:

a light receiving unit that includes M×N (M and N are integers equal to or greater than 2) pixels, the pixels being two-dimensionally arranged in a matrix of M rows and N columns and each of the pixels including a photodiode;

a plurality of signal output units that are provided in association with a plurality of column groups, respectively, wherein the column groups are divided from the N columns and each of the column groups includes two or more columns; and a vertical shift register that controls outputs from the pixels on row by row basis, wherein each of the plurality of signal output units includes:

two or more holding circuits that are provided in association with the two or more columns included in a corresponding column group, respectively, each of the holding circuits being configured to hold a signal in accordance with output from the pixels included in a corresponding column;

an input terminal electrode for inputting a vertical start signal that starts operation of the vertical shift register or a vertical clock signal that regulates clock of the vertical shift register; and an output terminal electrode that provides output signals from the holding circuits, a common line is provided across the plurality of signal output units, the common line being a vertical start common line for providing the vertical start signal to the vertical shift register or a vertical clock common line for providing the vertical clock signal to the vertical shift register, and the input terminal electrode in each of the signal output units is connected to the common line.

9. The solid-state imaging device according to claim 8, wherein each of the signal output units further includes: a switch provided between the input terminal electrode and the common line; and a control terminal electrode for inputting a switch control signal that controls connection/disconnection of the switch.

10. A method of manufacturing a solid-state imaging device, wherein the solid-state imaging device includes:

a light receiving unit that includes M×N (M and N are integers equal to or greater than 2) pixels, the pixels being two-dimensionally arranged in a matrix of M rows and N columns and each of the pixels including a photodiode;

a plurality of signal output units that are provided in association with a plurality of column groups, respectively, wherein the column groups are divided from the N columns and each of the column groups includes two or more columns; and a vertical shift register that controls outputs from the pixels on row by row basis, the method comprising:

a forming step of forming, in each of a plurality of regions which will be the plurality of signal output units on a semiconductor substrate, two or more holding circuits that are provided in association with the two or more columns included in a corresponding column group, respectively, each of the holding circuits being configured to hold a signal in accordance with output from the pixels included in a corresponding column, an input terminal electrode for inputting a vertical start signal that starts operation of the vertical shift register or a vertical clock signal that regulates clock of the vertical shift register, and an output terminal electrode that provides output signals from the holding circuits, and forming the light receiving unit and the vertical shift register on the semiconductor substrate;

a test step of testing operation of the light receiving unit and the plurality of signal output units on each column group basis; and a wire bonding step of connecting the input terminal electrode and the output terminal electrode of each of the signal output units in the semiconductor substrate selected in the test step to a wiring pattern that is prepared outside the semiconductor substrate, using wire bonding, wherein, in the forming step, a common line is provided across the plurality of signal output units, the common line being a vertical start common line for providing the vertical start signal to the vertical shift register or a vertical clock common line for providing the vertical clock signal to the vertical shift register; and the input terminal electrode in each of the signal output units is connected to the common line, and in the test step, on each signal output unit basis, a probe is brought into contact with the input terminal electrode, and the vertical start signal or the vertical clock signal is given to the input terminal electrode; and another probe is brought into contact with the output terminal electrode to acquire output signals, thereby testing operation of the light receiving unit and the plurality of signal output units.

11. A method of testing a solid-state imaging device, wherein the solid-state imaging device includes:

a light receiving unit that includes M×N (M and N are integers equal to or greater than 2) pixels, the pixels being two-dimensionally arranged in a matrix of M rows and N columns and each of the pixels including a photodiode;

a plurality of signal output units that are provided in association with a plurality of column groups, respectively, wherein the column groups are divided from the N columns and each of the column groups includes two or more columns; and a vertical shift register that controls outputs from the pixels on row by row basis, and wherein each of the plurality of signal output units includes:

two or more holding circuits that are provided in association with the two or more columns included in a corresponding column group, respectively, each of the holding circuits being configured to hold a signal in accordance with output from the pixels included in a corresponding column;

an input terminal electrode for inputting a vertical start signal that starts operation of the vertical shift register or a vertical clock signal that regulates clock of the vertical shift register; and an output terminal electrode that provides output signals from the holding circuits, the method comprising:

forming a common line across the plurality of signal output units, the common line being a vertical start common line for providing the vertical start signal to the vertical shift register or a vertical clock common line for providing the vertical clock signal to the vertical shift register; and connecting the input terminal electrode in each of the signal output units to the common line; and on each signal output unit basis, bringing a probe into contact with the input terminal electrode and supplying the vertical start signal or the vertical clock signal to the input terminal electrode, and bringing another probe into contact with the output terminal electrode to acquire output signals, thereby testing operations of the light receiving unit and the plurality of signal output units.

12. A solid-state imaging device comprising:

a light receiving unit that includes M×N (M and N are integers equal to or greater than 2) pixels, the pixels being two-dimensionally arranged in a matrix of M rows and N columns and each of the pixels including a photodiode;

a plurality of signal output units that are provided in association with a plurality of column groups, respectively, wherein the column groups are divided from the N columns and each of the column groups includes two or more columns; and a vertical shift register that controls outputs from the pixels on row by row basis, wherein each of the plurality of signal output units includes:

two or more holding circuits that are provided in association with the two or more columns included in a corresponding column group, respectively, each of the holding circuits being configured to hold a signal in accordance with output from the pixels included in a corresponding column;

an input terminal electrode for inputting a hold signal that controls input of voltage signals to the holding circuits; and an output terminal electrode that provides output signals from the holding circuits, a holding common line for providing the hold signal to the holding circuits of each of the signal output units is provided across the plurality of signal output units, and the input terminal electrode in each of the signal output units is connected to the holding common line.

13. The solid-state imaging device according to claim 12, wherein each of the signal output units further includes a switch provided between the input terminal electrode and the holding common line, and a control terminal electrode for inputting a switch control signal that controls connection/disconnection of the switch.

14. A method of manufacturing a solid-state imaging device, wherein the solid-state imaging device includes:

a light receiving unit that includes M×N (M and N are integers equal to or greater than 2) pixels, the pixels being two-dimensionally arranged in a matrix of M rows and N columns and each of the pixels including a photodiode;

a plurality of signal output units that are provided in association with a plurality of column groups, respectively, wherein the column groups are divided from the N columns and each of the column groups includes two or more columns; and a vertical shift register that controls outputs from the pixels on row by row basis, the method comprising:

a forming step of forming, in each of a plurality of regions which will be the plurality of signal output units on a semiconductor substrate, two or more holding circuits that are provided in association with the two or more columns included in a corresponding column group, respectively, each of the holding circuits being configured to hold a signal in accordance with output from the pixels included in a corresponding column, an input terminal electrode for inputting a hold signal that controls input of voltage signals to the holding circuits, and an output terminal electrode that provides output signals from the holding circuits, and forming the light receiving unit and the vertical shift register on the semiconductor substrate;

a test step of testing operation of the light receiving unit and the plurality of signal output units on each column group basis; and a wire bonding step of connecting the input terminal electrode and the output terminal electrode of each of the signal output units in the semiconductor substrate selected in the test step to a wiring pattern that is prepared outside the semiconductor substrate, using wire bonding, wherein, in the forming step, a holding common line for providing the hold signal to the holding circuits of each of the signal output units is provided across the plurality of signal output units; and the input terminal electrode in each of the signal output units is connected to the holding common line, and in the test step, on each signal output unit basis, a probe is brought into contact with the input terminal electrode and the hold signal is given to the input terminal electrode; and another probe is brought into contact with the output terminal electrode to acquire output signals, thereby testing operation of the light receiving unit and the plurality of signal output units.

15. A method of testing a solid-state imaging device, wherein the solid-state imaging device includes:

a light receiving unit that includes M×N (M and N are integers equal to or greater than 2) pixels, the pixels being two-dimensionally arranged in a matrix of M rows and N columns and each of the pixels including a photodiode;

a plurality of signal output units that are provided in association with a plurality of column groups, respectively, wherein the column groups are divided from the N columns and each of the column groups includes two or more columns; and a vertical shift register that controls outputs from the pixels on row by row basis, and wherein each of the plurality of signal output units includes:

two or more holding circuits that are provided in association with the two or more columns included in a corresponding column group, respectively, each of the holding circuits being configured to hold a signal in accordance with output from the pixels included in a corresponding column;

an input terminal electrode for inputting a hold signal that controls input of voltage signals to the holding circuits; and an output terminal electrode that provides output signals from the holding circuits, the method comprising:

forming a holding common line for providing the hold signal to the holding circuits of each of the signal output unit across the plurality of signal output units, and connecting the input terminal electrode in each of the signal output units to the holding common line; and on each signal output unit basis, bringing a probe into contact with the input terminal electrode and supplying the hold signal to the input terminal electrode, and bringing another probe into contact with the output terminal electrode to acquire output signals, thereby testing operations of the light receiving unit and the plurality of signal output units.

* * * * *